(12) United States Patent
Kurokawa

(10) Patent No.: US 9,594,115 B2
(45) Date of Patent: Mar. 14, 2017

(54) DEVICE FOR GENERATING TEST PATTERN

(71) Applicant: Semiconductor Energy Laboratory Co., Ltd., Atsugi-shi, Kanagawa-ken (JP)

(72) Inventor: Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 127 days.

(21) Appl. No.: 14/587,399

(22) Filed: Dec. 31, 2014

(65) Prior Publication Data

US 2015/0192641 A1 Jul. 9, 2015

(30) Foreign Application Priority Data

Jan. 9, 2014 (JP) .................. 2014-002134

(51) Int. Cl.
*G01R 31/02* (2006.01)
*G01R 31/317* (2006.01)
(Continued)

(52) U.S. Cl.
CPC ..... *G01R 31/3172* (2013.01); *G01R 31/3187* (2013.01); *G01R 31/318371* (2013.01);
(Continued)

(58) Field of Classification Search
CPC ....... H01L 21/00; H01L 2221/00; G09G 1/00; G09G 2230/00; G11C 5/00; G11C 2207/00
See application file for complete search history.

(56) References Cited

U.S. PATENT DOCUMENTS 4,654,829 A * 3/1987 Jiang ................. G11C 5/00
365/189.03
5,731,856 A 3/1998 Kim et al.
(Continued)

FOREIGN PATENT DOCUMENTS

EP 1737044 A 12/2006
EP 1840585 A 10/2007
(Continued)

OTHER PUBLICATIONS

Ishii.T et al., "A Poly-Silicon TFT With a Sub-5-nm Thick Channel for Low-Power Gain Cell Memory in Mobile Application", IEEE Transactions on Electron Devices, Nov. 1, 2004, vol. 51, No. 11, pp. 1805-1810.
(Continued)

*Primary Examiner* — Jermele M Hollington
*Assistant Examiner* — Temilade Rhodes-Vivour
(74) *Attorney, Agent, or Firm* — Fish & Richardson P.C.

(57) ABSTRACT

A device that is capable of generating a new test pattern after the design phase and has a small area of a circuit not in use during normal operation includes a first circuit and a second circuit. The second circuit includes a third circuit and fourth circuit. The fourth circuit has a function of storing data for determining the configuration of the third circuit. When a test for the operating state of the first circuit is performed, the second circuit has a function of generating a signal for the test. When the test is not performed, the second circuit has a function of storing data used for processing in the first circuit and a function of comparing a plurality of signals.

19 Claims, 18 Drawing Sheets

(51) Int. Cl.
  *G01R 31/3183* (2006.01)
  *G01R 31/3187* (2006.01)
  *H01L 21/00* (2006.01)

(52) U.S. Cl.
  CPC .......... *G11C 2207/00* (2013.01); *H01L 21/00* (2013.01); *H01L 2221/00* (2013.01)

(56) References Cited

U.S. PATENT DOCUMENTS

| | | | |
|---|---|---|---|
| 5,744,864 A | 4/1998 | Cillessen et al. | |
| 6,127,702 A | 10/2000 | Yamazaki et al. | |
| 6,294,274 B1 | 9/2001 | Kawazoe et al. | |
| 6,436,741 B2 | 8/2002 | Sato et al. | |
| 6,563,174 B2 | 5/2003 | Kawasaki et al. | |
| 6,601,218 B2 | 7/2003 | Sato et al. | |
| 6,615,402 B2 | 9/2003 | Kaneko et al. | |
| 6,678,645 B1 | 1/2004 | Rajsuman et al. | |
| 6,727,522 B1 | 4/2004 | Kawasaki et al. | |
| 6,874,107 B2 | 3/2005 | Lesea | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,245,134 B2 | 7/2007 | Granicher et al. | |
| 7,282,782 B2 | 10/2007 | Hoffman et al. | |
| 7,297,977 B2 | 11/2007 | Hoffman et al. | |
| 7,307,433 B2 | 12/2007 | Miller et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,487,416 B2 | 2/2009 | Oota | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,581,610 B2 | 11/2013 | Miller et al. | |
| 8,675,382 B2 | 3/2014 | Kurokawa | |
| 2001/0046027 A1 | 11/2001 | Tai et al. | |
| 2002/0010886 A1 | 1/2002 | Tanaka et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0030056 A1 | 2/2005 | Woo et al. | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0025143 A1* | 2/2007 | Fujita | G06F 12/0891 365/154 |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0234160 A1 | 10/2007 | Oota | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0028148 A1* | 1/2008 | Wallner | G06F 12/023 711/118 |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0072232 A1* | 3/2009 | Hayashi | H01L 21/28202 257/43 |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0042870 A1 | 2/2010 | Amatsubo | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0148171 A1 | 6/2010 | Hayashi et al. | |
| 2011/0116332 A1* | 5/2011 | Naka | G11C 29/12005 365/201 |
| 2013/0207170 A1 | 8/2013 | Kurokawa | |
| 2013/0262828 A1* | 10/2013 | Yoneda | G06F 9/30145 712/208 |
| 2013/0285697 A1 | 10/2013 | Kurokawa | |
| 2013/0286757 A1 | 10/2013 | Takemura | |
| 2013/0314124 A1 | 11/2013 | Ikeda et al. | |
| 2013/0321025 A1 | 12/2013 | Kurokawa et al. | |
| 2015/0123684 A1* | 5/2015 | Kurokawa | G01R 31/31813 324/750.3 |
| 2015/0144948 A1* | 5/2015 | Kurokawa | H01L 29/7869 257/48 |

FOREIGN PATENT DOCUMENTS

| | | |
|---|---|---|
| EP | 2226847 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 08-264794 A | 9/1988 |
| JP | 63-239117 A | 10/1988 |
| JP | 63-265818 A | 11/1988 |
| JP | 05-142297 A | 6/1993 |
| JP | 05-251705 A | 9/1993 |
| JP | 08-264794 A | 10/1996 |

(56) References Cited

FOREIGN PATENT DOCUMENTS

| JP | 11-505377 | | 5/1999 |
|---|---|---|---|
| JP | 2000-044236 | A | 2/2000 |
| JP | 2000-150900 | A | 5/2000 |
| JP | 2001-297598 | A | 10/2001 |
| JP | 2002-076356 | A | 3/2002 |
| JP | 2002-197900 | A | 7/2002 |
| JP | 08-264794 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 08-264794 | A | 12/2004 |
| JP | 2006-162285 | A | 6/2006 |
| JP | 2007-264995 | A | 10/2007 |
| JP | 2010-044578 | A | 2/2010 |
| JP | 2011-055164 | A | 3/2011 |
| WO | WO-00/62339 | | 10/2000 |

OTHER PUBLICATIONS

Kim.W et al., "An Experimental High-Density DRAM Cell with a Built-in Gain Stage", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transistion:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

(56) References Cited

OTHER PUBLICATIONS

Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White TANDEM OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
International Search Report (Application No. PCT/IB2014/067304) Dated Mar. 31, 2015.
Written Opinion (Application No. PCT/IB2014/067304) Dated Mar. 31, 2015.

* cited by examiner

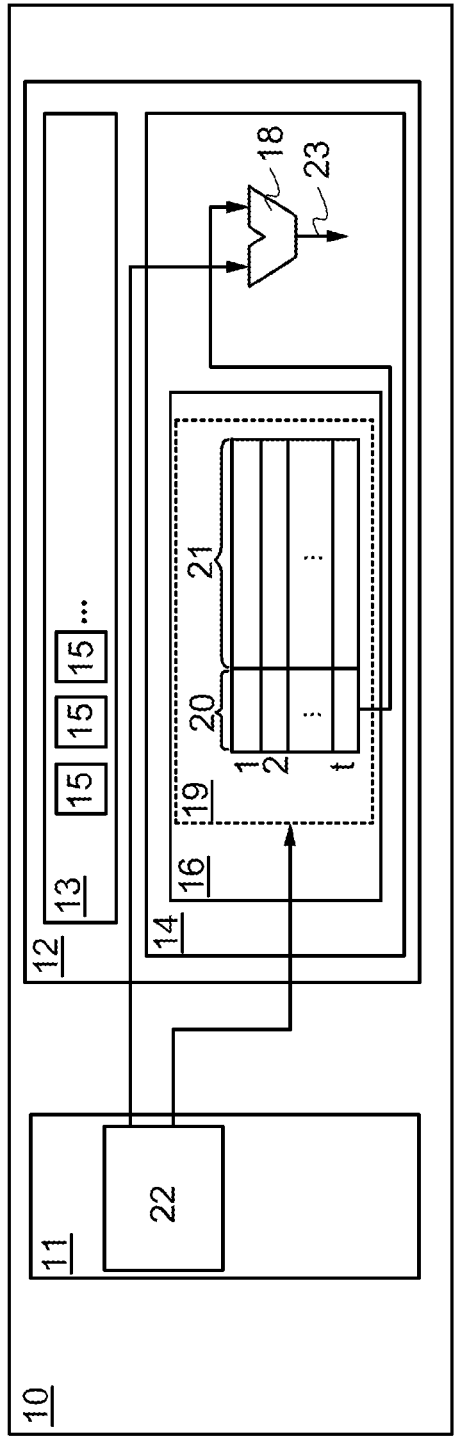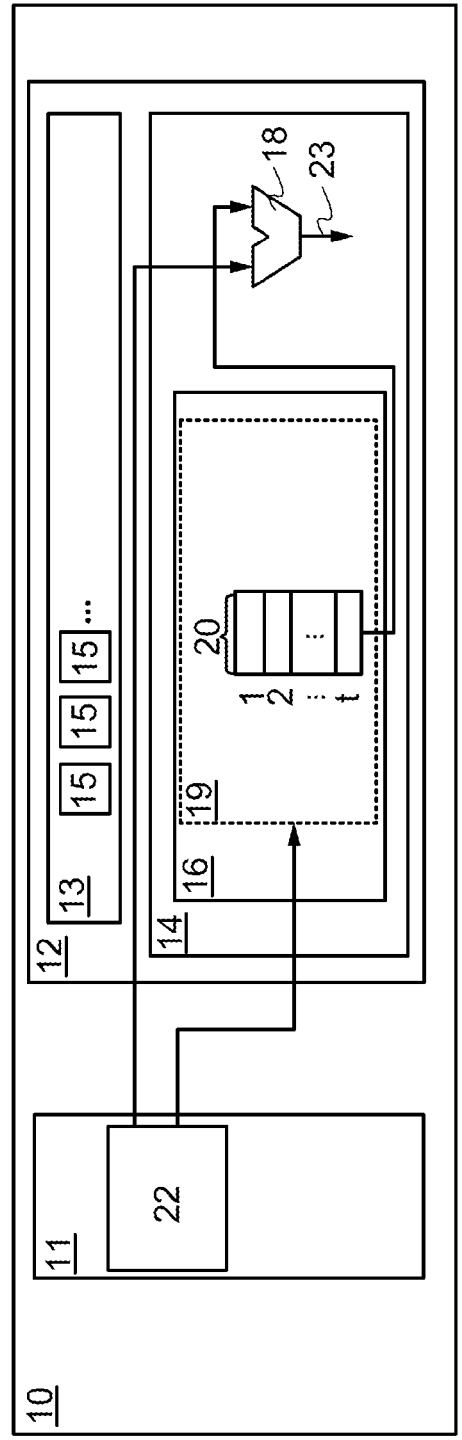

DEVICE FOR GENERATING TEST PATTERN

TECHNICAL FIELD

One embodiment of the present invention relates to a device including a test circuit.

Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition of matter. Specifically, examples of the technical field of one embodiment of the present invention disclosed in this specification include devices such as a semiconductor device, a display device, a liquid crystal display device, a light-emitting device, a lighting device, a power storage device, and a memory device; a method for driving any of the devices; and a method for manufacturing any of the devices.

BACKGROUND ART

With the recent increase in the circuit size of devices including a processor or the like (hereinafter also referred to as chips), a test on chips during the design phase and one before shipment (hereinafter collectively referred to as a chip test) are imposing enormous costs.

There are a variety of techniques for chip tests, and a built-in self-test (BIST) is known as an example. The BIST is a technique for a chip test using a dedicated circuit (hereinafter referred to as a BIST circuit) that has a function of an LSI tester conducting a chip test and is incorporated into a chip. Examples of LSI tester functions are a function of generating a test pattern, a function of supplying the test pattern to the chip as an input signal, a function of obtaining an output signal of the chip, and a function of comparing the output signal with an expected value. As compared to the case of using only an LSI tester, the use of the BIST can cut the costs required for a chip test and increase the speed of the chip test. Patent Document 1 discloses a technique for achieving a BIST circuit provided outside LSI by using a field-programmable gate array (FPGA).

REFERENCE

Patent Document 1: Japanese Published Patent Application No. H5-142297

DISCLOSURE OF INVENTION

To improve the quality of a chip test with a test circuit incorporated in a chip, such as a BIST circuit, or to perform a chip test appropriate for a device with a complicated function, the test circuit is required to have a function of generating a wide variety of test patterns. However, as the number and kind of test patterns to be generated increase, the size of the test circuit increases and the area occupied by the test circuit in the device increases accordingly.

Test patterns to be generated in the test circuit are set during the chip design phase; thus, to additionally perform a chip test using a new test pattern, the new test pattern is required to be supplied from an LSI tester or the like outside the chip. In this case, it is difficult to enjoy benefits of a chip test with a test circuit, such as an increase in chip test speed and a reduction in chip test cost.

In view of the foregoing technical background, an object of one embodiment of the present invention is to provide a novel device. Another object of one embodiment of the present invention is to provide a device in which the area of a circuit that is not in use during normal operation is small. Another object of one embodiment of the present invention is to provide a device capable of generating a new test pattern after the design phase.

One embodiment of the present invention does not necessarily achieve all the objects listed above and only needs to achieve at least one of the objects. The description of the above objects does not disturb the existence of other objects. Other objects are apparent from and can be derived from the description of the specification, the drawings, and the claims.

A device in one embodiment of the present invention includes a first circuit, and a second circuit including a third circuit and fourth circuit. The fourth circuit has a function of storing data for determining a configuration of the third circuit. When a test for an operating state of the first circuit is performed, the second circuit has a function of generating a signal for the test. When the test is not performed, the second circuit has a function of storing data used for processing in the first circuit and a function of comparing a plurality of signals.

In the device of one embodiment of the present invention, when the test is not performed, the fourth circuit may have a function of serving as a memory region in a cache memory of the first circuit and a function of determining whether data stored in the memory region and data input from the first circuit match or not.

In the device of one embodiment of the present invention, the fourth circuit may include a first transistor and a second transistor, and one of a source and a drain of the first transistor may be electrically connected to a gate of the second transistor.

In the device of one embodiment of the present invention, it is possible that the first transistor includes a first semiconductor film including a first channel formation region, the second transistor includes a second semiconductor film including a second channel formation region, the first semiconductor film contains an oxide semiconductor, and the second semiconductor film contains a material other than the oxide semiconductor.

In the device of one embodiment of the present invention, the oxide semiconductor may contain In, Ga, and Zn.

One embodiment of the present invention can provide a novel device. Another embodiment of the present invention can provide a device in which the area of a circuit that is not in use during normal operation is small. Another embodiment of the present invention can provide a device capable of generating a new test pattern after the design phase.

Note that the description of these effects does not disturb the existence of other effects. One embodiment of the present invention does not necessarily achieve all the above effects. Other effects will be apparent from and can be derived from the description of the specification, the drawings, and the claims.

BRIEF DESCRIPTION OF DRAWINGS

In the accompanying drawings:

FIGS. 2A and 2B illustrate device structures.

BEST MODE FOR CARRYING OUT THE INVENTION

Figure 1A:
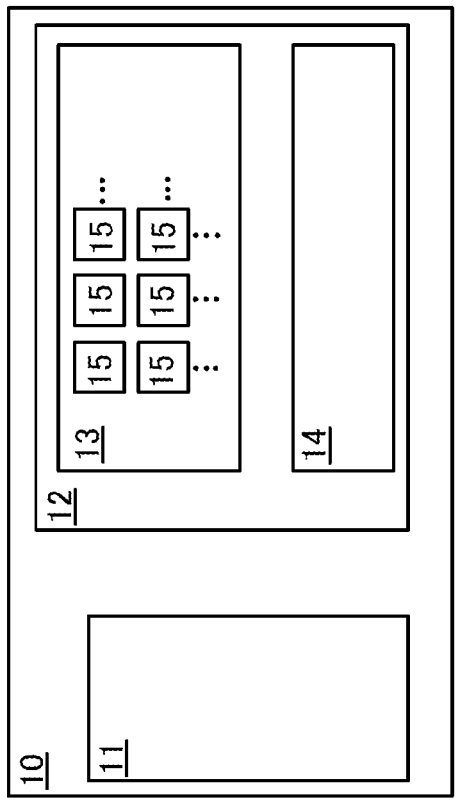
FIGS. 1A to 1C illustrate device structures.

Embodiments of the present invention will be described below in detail with reference to the drawings. Note that the present invention is not limited to the following description, and it is easily understood by those skilled in the art that the mode and details can be variously changed without departing from the spirit and scope of the present invention. Therefore, the present invention should not be construed as being limited to the description of the embodiments below.

Note that one embodiment of the present invention includes, in its category, any device including a semiconductor integrated circuit (IC), such as a radio frequency (RF) tag, a semiconductor display device, a programmable logic device (PLD) such as an FPGA, an IC, and LSI. A display device includes, in its category, display devices with a driver circuit including an IC, such as a liquid crystal display device, a light-emitting device in which a light-emitting element typified by an organic light-emitting element is provided in each pixel, electronic paper, a digital micromirror device (DMD), a plasma display panel (PDP), and a field emission display (FED).

Note that the term "connection" in this specification refers to electrical connection as well as direct connection and corresponds to a configuration in which current, voltage, or potential can be supplied or transmitted. Therefore, a configuration in which two circuits or two elements are connected does not necessarily refer to a configuration in which they are directly connected, and also refers to a configuration in which they are indirectly connected through an element such as a wiring, a resistor, a diode, or transistor so that current, voltage, or potential can be supplied or transmitted. In addition, even when different components are connected to each other in a circuit diagram, there is actually a case where one conductive film has functions of a plurality of components, such as a case where part of a wiring serves as an electrode. The term "connection" in this specification also means such a case where one conductive film has functions of a plurality of components.

A source of a transistor means a source region that is part of a semiconductor film functioning as an active layer or a source electrode electrically connected to the semiconductor film. Similarly, a drain of a transistor means a drain region that is part of a semiconductor film functioning as an active layer or a drain electrode electrically connected to the semiconductor film. A gate means a gate electrode.

The terms "source" and "drain" of a transistor interchange with each other depending on the type of the channel of the transistor or the levels of potentials applied to the terminals. In general, in an n-channel transistor, a terminal to which a lower potential is applied is referred to as a source, and a terminal to which a higher potential is applied is referred to as a drain. Furthermore, in a p-channel transistor, a terminal to which a lower potential is applied is referred to as a drain, and a terminal to which a higher potential is applied is referred to as a source. In this specification, the connection relation of the transistor is sometimes described assuming that the source and the drain are fixed for convenience; actually, the names of the source and the drain interchange with each other depending on the relation of the potentials.

Embodiment 1

Figure 1B:
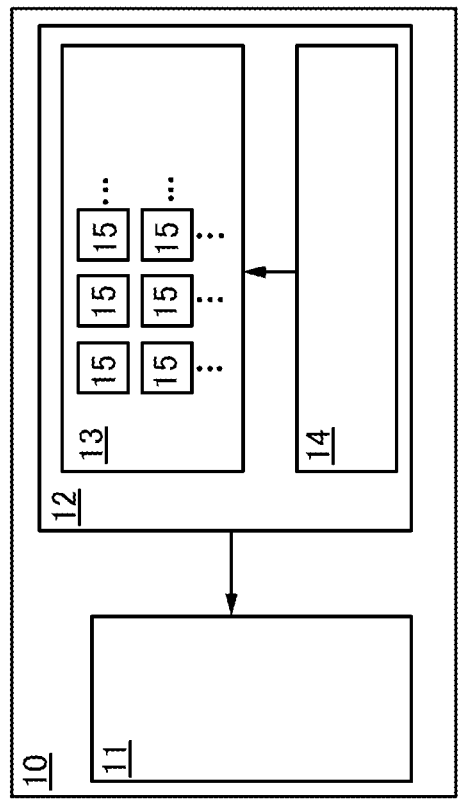
Figure 1C:
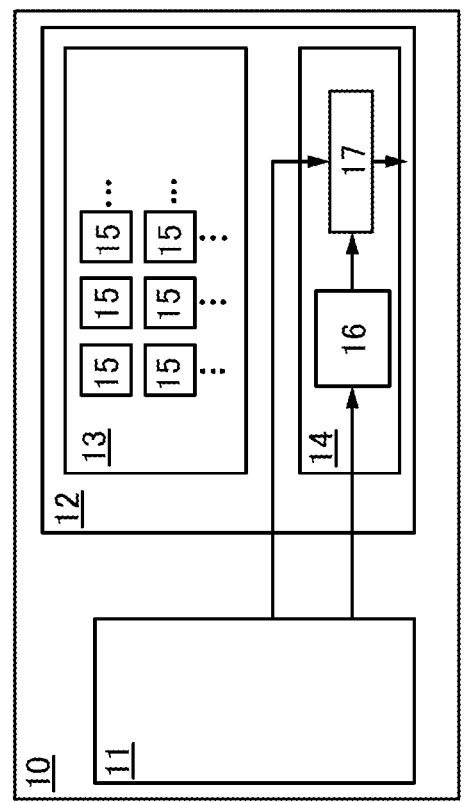

FIGS. 1A to 1C illustrate an example of the structure of a device in one embodiment of the present invention. A device 10 in FIG. 1A includes a circuit 11 and a circuit 12.

The circuit 11 has a function of performing arithmetic operation, control, and the like and is typically an integrated circuit including a plurality of transistors. For example, the circuit 11 can include a variety of logic circuits such as a sequential circuit and a combinational circuit. The circuit 11 can be used as a central processing unit (CPU) or the like. Like the circuit 11, the circuit 12 is typically an integrated circuit including a plurality of transistors. Alternatively, the circuit 12 may be a circuit capable of reconfiguring itself (a reconfigurable circuit).

The circuit 12 includes a circuit 13 and a circuit 14. The circuit 13 includes a plurality of circuits 15 with a function of a logic circuit such as a sequential circuit or a combinational circuit (also referred to as programmable logic elements (PLEs)). The circuit 14 has a function of storing data for determining a configuration of the circuit 13 (hereinafter also referred to as configuration data), and a function of controlling electrical continuity between the circuits 15 on the basis of the configuration data. The circuit 14 may separately include a circuit with a function of storing the configuration data (hereinafter also referred to as a configuration memory) and a routing switch for controlling electrical continuity between the circuits 15 (hereinafter also referred to as a programmable switch), or may include a circuit having functions of both a configuration memory and a routing switch.

The routing switches are controlled based on configuration data stored in the circuit 14 to control electrical continuity between the circuits 15, whereby the circuit 12 can be reconfigured as an intended logic circuit.

In one embodiment of the present invention, the circuit 12 has a function of a circuit that generates a signal for testing the operating state of the circuit 11 (also referred to as a test pattern), that is, a test circuit for the circuit 11; and a function of a circuit used as part of the circuit 11, that is, an extension circuit for the circuit 11 when the circuit 11 is in normal operation. The configurations of the circuit 12 with these functions will be described with reference to FIGS. 1B and 1C.

FIG. 1B illustrates the configuration of the circuit 12 when functioning as a test circuit for the circuit 11.

In FIG. 1B, the circuit 14 stores configuration data for reconfiguring the circuit 13 and generating a test pattern in the circuit 12, and the routing switches are controlled based on the configuration data to control electrical continuity between the circuits 15, whereby the circuit 12 can be reconfigured as a test circuit. Then, a test pattern is generated in the circuit 12 and output to the circuit 11.

When a test pattern is input to the circuit 11, a test for the operating state of the circuit 11 is performed. This test may be a test for the operating state of part of the circuit 11 or the entire circuit 11. For example, when the circuit 11 includes a memory element, the operating state of the memory element may be tested (e.g., whether data is stored appropriately). Moreover, when the circuit 11 includes an analog circuit with a function of synchronizing phases, the operating state of the analog circuit may be tested.

At least one of the circuits 15 may have a function of a logic circuit and also a function of storing configuration data for changing the configuration of the logic circuit. By changing configuration data stored in the circuit 15, the configuration of the circuit 15 is changed and a logic operation performed in the circuit 15 can be changed. Thus, one circuit 15 can be provided with a function of performing multiple kinds of logic operation, so that the kind of test patterns generated in the circuit 12 can be increased while the number of circuits 15 is not increased. Furthermore, the details of a test for the operating state can be changed without supply of a signal for generating another test pattern from the outside.

It is possible that a test for the operating state of the circuit 11 is performed in accordance with a test pattern, and then data corresponding to the test result is transmitted from the circuit 11 to the circuit 12 and the circuit 12 evaluates the operating state of the circuit 11. In this case, the circuit 12 has a function of evaluating the operating state of the circuit 11.

FIG. 1C illustrates the configuration of the circuit 12 when functioning as a circuit used as an extension circuit for the circuit 11.

When the circuit 11 is in normal operation, a test for the operating state of the circuit 11 is not performed and generation of a test pattern is not necessary in the circuit 12. At this time, the circuit 12 serves as an extension circuit for the circuit 11, for example, a circuit that stores data used for processing in the circuit 11 or a logic circuit with a function of comparing input signals. That is, at least part of the circuit 14, which operates as a configuration memory for a test pattern generator circuit and a routing switch during a test for the operating state of the circuit 11, functions as an extension circuit for the circuit 11 during normal operation of the circuit 11. Consequently, the area of a circuit that is unnecessary during normal operation of the circuit 11 can be reduced in the device 10.

Using FIG. 1C as an example, the description is made on the case where the circuit 14 has a function of storing data used for processing in the circuit 11 and a function of determining whether data stored in a memory circuit 16 and data input from the outside (e.g., from the circuit 11 here) match or not. Here, the memory circuit 16 has a function of storing data, and a circuit 17 has a function of determining whether input data match or not. Note that the circuit 17 is not limited to having the above function and may have a function of determining whether data input from the outside match or not, or a function of determining whether data from the memory circuit 16 match or not.

When data from the circuit 11 and data from the memory circuit 16 are input to the circuit 17, the circuit 17 performs a logic operation to compare these two signals and outputs the result. Although the memory circuit 16 and the circuit 17 are shown as different circuits in FIG. 1C, the circuit 14 may include a circuit with functions of both the memory circuit 16 and the circuit 17.

In the circuit 14, the memory circuit 16 can store data used for a logic operation in the circuit 11, data obtained as a result of the logic operation in the circuit 11, or data corresponding to the details of processing performed in the circuit 11. The circuit 17 can function as a coincidence circuit, an anticoincidence circuit, or the like. Thus, the circuit 14 can be used as a cache memory of the circuit 11, for example. In this case, the memory circuit 16 can function as a circuit that stores tag data in the cache memory of the circuit 11, and the circuit 17 can function as a coincidence circuit, an anticoincidence circuit, a content addressable memory (CAM), or the like to compare an address input from the circuit 11 and tag data stored in the memory circuit 16. Furthermore, the circuit 14 can be used for a memory that stores a tag (page number) of a translation look-aside buffer (TLB) in virtual memory, an address comparator of a branch predictor circuit, or the like.

Switching of the function of the circuit 12 between the test circuit and the extension circuit can be performed by input of a control signal to the circuit 12 from an input/output device (not illustrated). Alternatively, an instruction to function switching may be stored in a memory circuit (not illustrated) included in the circuit 11, in which case the functions may be switched in accordance with the instruction when the device 10 is powered on. When the circuits 15 are made to have high output impedance and a signal from the circuits 15 to the circuit 14 is interrupted, the circuit 14 can be used as an independent circuit (e.g., a cache memory).

In the device of one embodiment of the present invention, the circuit 12 used as a test circuit while the operating state of the circuit 11 is tested can be used as an extension circuit during normal operation of the circuit 11. Therefore, the area of a circuit that is unnecessary during normal operation of the circuit 11 can be reduced in the device 10.

Note that this embodiment can be implemented in combination with other embodiments as appropriate.

Embodiment 2

In this embodiment, an example of a specific structure of the device 10 illustrated in FIGS. 1A to 1C will be described.

FIGS. 2A and 2B illustrate an example where the circuit 14 is used as an extension circuit for the circuit 11, specifically a cache memory when the circuit 11 is in normal operation.

To test the operating state of the circuit 11, the routing switches are controlled on the basis of configuration data stored in the circuit 14 and the circuit 12 is reconfigured as a test circuit as shown in FIG. 1B. Then, a test pattern is generated in the circuit 12 and output to the circuit 11.

In contrast, while the circuit 11 operates normally, the circuit 14 has a function of the cache memory of the circuit 11 as illustrated in FIG. 2A. Specifically, the circuit 14 includes the memory circuit 16 and a comparator circuit 18, and at least part of the memory circuit 16 includes a memory region 19 serving as a memory region of the cache memory. Although the circuit 14 includes the memory circuit 16 and the comparator circuit 18 separately in FIG. 2A, the circuit 14 is not limited to having this structure and may include a circuit with functions of both the memory circuit 16 and the comparator circuit 18.

Here, the memory region 19 functions as a memory region of the cache memory of the circuit 11 and can store a copy of part of data stored in the main memory. Specifically, the memory region 19 includes a plurality of memory regions with a predetermined data storage capacity (hereinafter referred to as lines). FIG. 2A illustrates the case where the memory region 19 includes t lines (t is a natural number of 2 or more). Each line in the memory region 19 includes a data field 21 corresponding to a memory region where data is stored, and a tag field 20 corresponding to a memory region where one or more high-order bit of an address in the main memory (tag data) corresponding to data stored in the data field 21 is stored. Which data field 21 of a line to store data is determined by one or more low-order bit of the address in the main memory corresponding to the data.

The comparator circuit 18 has a function of comparing a high-order bit of an address to which access is requested by a processor 22 included in the circuit 11 with tag data stored in the tag field 20 of a line specified by a low-order bit of the address and outputting the comparison result as a signal 23 (a tag hit signal). This comparison can determine whether data corresponding to the address to which access is requested by the processor 22 is stored in the memory region 19 (cache hit) or not (cache miss). When a cache hit occurs, data stored in the data field of a corresponding line is used as intended data in processing of the circuit 11.

Next, the description is made on an example of the circuit 14 that operates as a cache memory when access is requested by the processor 22 during normal operation of the circuit 11.

When there is a request for access to a given address from the processor 22, a low-order bit of the address is transmitted to the memory region 19 and a high-order bit of the address is transmitted to the comparator circuit 18. Then, in the memory region 19, tag data stored in the tag field 20 of a line specified by the low-order bit of the address received from the processor 22 is read out and transmitted to the comparator circuit 18.

The comparator circuit 18 compares the high-order bit of the address to which access is requested by the processor 22 and the tag data read from the tag field 20. When the comparison result indicates that the high-order bit of the address and the tag data match, it means that data corresponding to the address to which access is requested by the processor 22 is stored in the memory region 19. In contrast, when the comparison result indicates that the high-order bit of the address and the tag data do not match, it means that data corresponding to the address to which access is requested by the processor 22 is not stored in the memory region 19. Then, the comparison result is output from the comparator circuit 18 as the signal 23 (the tag hit signal). When data corresponding to the address to which access is requested by the processor 22 is stored in the memory region 19, data stored in the data field of a line specified by the low-order bit of the address can be used as intended data for processing in the circuit 11.

Although not illustrated in FIG. 2A, identification information on the validity of data stored in the data field of each line in the memory region 19 may be stored in a specific memory region.

Although the memory region 19 includes the tag field 20 and the data field 21 in FIG. 2A, the memory region 19 may include only the tag field 20 as illustrated in FIG. 2B. In that case, a data field is provided outside the memory region 19.

In the above manner, the circuit 14 can be used as a cache memory while the circuit 11 is in normal operation. The cache memory can be a fully associative cache, a direct mapped cache, or a set associative cache.

It is possible that the circuit 11 further includes a memory circuit and the memory circuit as well as the memory circuit 16 is used as a cache memory. In this case, a set associative cache memory can be configured with a memory region of the memory circuit in the circuit 11 and the memory region 19 in the memory circuit 16. Specifically, it is efficient to use the memory circuit 16 as an (n+1)th set for the n-way set associative cache memory included in the circuit 11. This structure can increase the number of sets in the cache memory as compared to the case where either the memory circuit in the circuit 11 or the memory circuit 16 is used as the cache memory. Thus, thrashing can be less likely to occur and the cache memory hit ratio can be increased, whereby the performance of the device 10 can be improved.

In the device of one embodiment of the present invention, the circuit 12 used as a test circuit while the operating state of the circuit 11 is tested can be used as an extension circuit, specifically a cache memory during normal operation of the circuit 11. Therefore, the area of a circuit that is unnecessary during normal operation of the circuit 11 can be reduced in the device 10.

Note that this embodiment can be implemented in combination with other embodiments as appropriate.

Embodiment 3

In this embodiment, an example of a specific structure of the circuit 14 illustrated in FIGS. 1A to 1C will be described.

Figure 3:
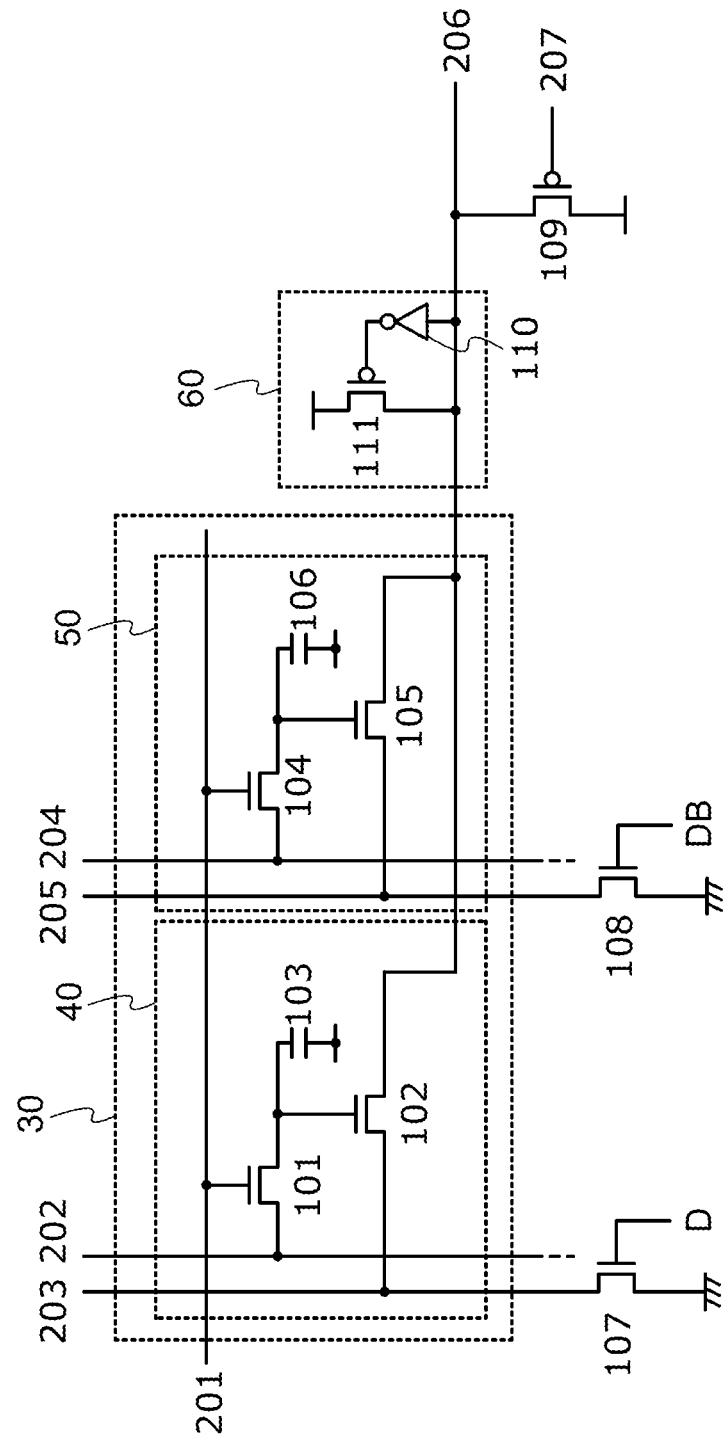
FIG. 3 is a circuit diagram illustrating a device structure.

FIG. 3 illustrates an example of a specific configuration of the circuit 14. The circuit 14 includes a circuit 30 including cells 40 and 50. The cell 40 includes transistors 101 and 102 and a capacitor 103. The cell 50 includes transistors 104 and 105 and a capacitor 106. Gates of the transistors 101 and 104 are connected to a wiring 201. One of a source and a drain of the transistor 101 is connected to a wiring 202 and the other is connected to a gate of the transistor 102. One electrode of the capacitor 103 is connected to the other of the source and the drain of the transistor 101 and the gate of the transistor 102, and the other electrode thereof is connected to a wiring supplied with a predetermined potential. One of a source and a drain of the transistor 102 is connected to a wiring 203 and the other is connected to a wiring 206. One of a source and a drain of the transistor 104 is connected to a wiring 204 and the other is connected to a gate of the transistor 105. One electrode of the capacitor 106 is connected to the other of the source and the drain of the transistor 104 and the gate of the transistor 105, and the other electrode thereof is connected to a wiring supplied with a predetermined potential. One of a source and a drain of the transistor 105 is connected to a wiring 205 and the other is connected to the wiring 206.

The wiring 201 has a function of transmitting a signal for controlling the on/off state of the transistors 101 and 104 and can be referred to as a word line 201. The wiring 202 has a function of transmitting a signal for storing data in the cell 40 and can be referred to as a bit line 202. The wiring 204 has a function of transmitting a signal for storing data in the cell 50 and can be referred to as a bit line 204. The wiring 203 is a wiring whose electrical continuity with the wiring 206 is controlled by the cell 40, and can be referred to as an output line 203. The wiring 205 is a wiring whose electrical continuity with the wiring is controlled by the cell 50, and can be referred to as an output line 205. The wiring 206 has a function of transmitting signals from a PLE, an input/output device, and the like and can be referred to as an input line 206.

The circuit 14 also includes transistors 107 and 108. One of a source and a drain of the transistor 107 is connected to the wiring 203 and the other is connected to a wiring supplied with a predetermined potential. One of a source and a drain of the transistor 108 is connected to the wiring 205 and the other is connected to a wiring supplied with a predetermined potential. Here, the description is made on the case where the wiring that is supplied with a predetermined potential and connected to the transistor 107 and the wiring that is supplied with a predetermined potential and connected to the transistor 108 are low power supply lines, particularly ground lines; however, they are not limited to the above and may be a high power supply line or a low power supply line other than a ground line. The level of the predetermined potential is not limited to a specific value (e.g., 0 V).

The circuit 14 also includes a transistor 109. A gate of the transistor 109 is connected to a wiring 207. One of a source and a drain of the transistor 109 is connected to the wiring 206 and the other is connected to a wiring supplied with a predetermined potential. In an initial state immediately after the device 10 is powered on, for example, the potential of the wiring 206 may become an intermediate potential between high-level and low-level potentials. If the intermediate potential is supplied to an input terminal of a PLE connected to the wiring 206, a shoot-through current is likely to be generated in a circuit element connected to the input terminal of the PLE. However, the potential of the wiring 206 can be initialized by providing the transistor 109; thus, the input terminal can be prevented from having an intermediate potential immediately after power-on, and generation of shoot-through current in the circuit element can be avoided.

The circuit 14 may include a latch circuit 60. The latch circuit 60 includes a transistor 111 and an inverter 110. An input terminal of the inverter 110 is connected to the wiring 206 and an output terminal thereof is connected to a gate of the transistor 111. One of a source and a drain of the transistor 111 is connected to the wiring 206 and the other is connected to a wiring supplied with a predetermined potential. The latch circuit 60 has a function of retaining the potential of the wiring 206, whereby the wiring 206 can be prevented from being floating. Thus, an input terminal of a PLE can be prevented from having an intermediate potential, and generation of shoot-through current in a circuit element connected to the input terminal can be avoided.

Here, the description is made on the case where the wiring that is supplied with a predetermined potential and connected to the transistor 109 and the wiring that is supplied with a predetermined potential and connected to the transistor 111 are high power supply lines; however, they are not limited to the above and may be a low power supply line such as a ground line. The level of the predetermined potential is not limited to a specific value (e.g., 0 V).

FIG. 3 illustrates that the circuit 14 includes the wirings 202 to 205, the transistors 107 and 108, and one circuit 30 connected to these wirings and transistors; however, one embodiment of the present invention is not limited to this structure. For example, the circuit 14 may include a plurality of groups of the wirings 202 to 205 and the transistors 107 and 108, and a plurality of circuits 30 connected to these wirings and transistors. In that case, the gates of the transistors 101 and 104 included in the circuits 30 may be connected to the wiring 201.

In FIG. 3, the transistors 101, 102, 104, 105, 107, and 108 are n-channel transistors and the transistors 109 and 111 are p-channel transistors; however, one embodiment of the present invention is not limited to this structure, and each of the transistors 101, 102, 104, 105, 107, 108, 109, and 111 may be an n-channel transistor or a p-channel transistor.

Each of the cells 40 and 50 may also include another element such as a transistor, a diode, a resistor, a capacitor, or an inductor as necessary.

First, the case where the circuit 12 is used as a test circuit will be described.

At the time of generating a test pattern, the circuit 14 functions as a configuration memory and a programmable switch that is a routing switch. Specifically, the transistors 101 and 104 are turned on by controlling the potential of the wiring 201, and the potential of the wiring 202 is supplied to the gate of the transistor 102 to store configuration data in the cell 40 and the potential of the wiring 204 is supplied to the gate of the transistor 105 to store configuration data in the cell 50. Thus, the cells 40 and 50 serve as a configuration memory. The transistor 102 serves as a programmable switch that controls electrical continuity between the wiring 203 and the wiring 206 in accordance with configuration data stored in the cell 40. Similarly, the transistor 105 serves as a programmable switch that controls electrical continuity between the wiring 205 and the wiring 206 in accordance with configuration data stored in the cell 50.

Here, data stored in the cells 40 and 50 are configuration data for configuring the circuit 12 as a test circuit. The circuit 12 is reconfigured based on the configuration data, and a test pattern is generated in the circuit 12.

Next, the case where the circuit 12 is used as an extension circuit, specifically a cache memory while the circuit 11 operates normally will be described.

The circuit 12 functions as a tag field and a comparator circuit of the cache memory. An example where the circuit 12 serves as a 1-bit tag field and a comparator circuit is described here; however, when including n pairs of the cells 40 and 50, the circuit 12 can serve as an n-bit tag field and a comparator circuit.

First, the transistor 109 is turned on by setting the wiring 207 at a predetermined potential, whereby the potential of the wiring 206 is set high. After that, first data is input to a wiring D connected to the gate of the transistor 107, and inverted data of the first data is input to a wiring DB connected to the gate of the transistor 108. Here, assuming that second data is stored in the gate of the transistor 105 in the cell 50 and inverted data of the second data is stored in the gate of the transistor 102 in the cell 40 as tag data of the cache memory, the potential of the wiring 206 remains high when the first data and the second data are the same and becomes low when the first data and the second data are different from each other.

As a specific example, the case where the second data is high-level data is considered, in which the potential of the gate of the transistor 105 in the cell 50 is high, the potential of the gate of the transistor 102 in the cell 40 is low, high-level data is stored in the cell 50 as the second data, and low-level data is stored in the cell 40 as inverted data of the second data. In this case, the transistor 102 is off and the transistor 105 is on. When high-level data is supplied to the wiring D as the first data and low-level data is supplied to the wiring DB as inverted data of the first data, the transistor 107 is turned on, the transistor 108 is turned off, and the potential of the wiring 206 remains high. This means that the first data and the second data match. In contrast, when low-level data is supplied to the wiring D as the first data and high-level data is supplied to the wiring DB as inverted data of the first data, the transistor 107 is turned off, the transistor 108 is turned on, and electrical continuity is established between the wiring 206 and the ground line. Thus, the potential of the wiring 206 becomes low. This means that the first data and the second data mismatch.

The case where the second data is low-level data is considered, in which the potential of the gate of the transistor 105 in the cell 50 is low, the potential of the gate of the transistor 102 in the cell 40 is high, low-level data is stored in the cell 50 as the second data, and high-level data is stored in the cell 40 as inverted data of the second data. In this case, the transistor 102 is on and the transistor 105 is off. When high-level data is supplied to the wiring D as the first data and low-level data is supplied to the wiring DB as inverted data of the first data, the transistor 107 is turned on, the transistor 108 is turned off, and electrical continuity is established between the wiring 206 and the ground line. Thus, the potential of the wiring 206 becomes low. This means that the first data and the second data mismatch. In contrast, when low-level data is supplied to the wiring D as the first data and high-level data is supplied to the wiring DB as inverted data of the first data, the transistor 107 is turned off, the transistor 108 is turned on, and the potential of the wiring 206 remains high. This means that the first data and the second data match.

As above, it is possible to configure a comparator circuit that can determine whether the first data and the second data match or not by storing the second data and inverted data of the second data in a pair of two cells (the cells 40 and 50) and supplying the first data and inverted data of the first data from the wiring D and the wiring DB. A high-order bit of an address issued by the processor is used as the first data and tag data stored in a tag field of a line of the cache memory specified by a low-order bit of the address is used as the second data, whereby the circuit 12 can serve as a tag field and a comparator circuit of the cache memory.

Note that the cells 40 and 50 are not limited to having the above configuration and may include a switch or the like between the wiring, the transistor, and the capacitor. For example, as illustrated in FIG. 4A, a transistor 120 functioning as a switch can be provided between the transistor 102 and the wiring 206 in the cell 40. A gate of the transistor 120 is connected to a wiring 210. One of a source and a drain of the transistor 120 is connected to one of the source and the drain of the transistor 102 and the other is connected to the wiring 206 in FIG. 3. With such a configuration, electrical continuity between the wiring 203 and the wiring 206 can be controlled by controlling the potential of the wiring 210, regardless of configuration data stored in the cell 40.

Figure 4B:
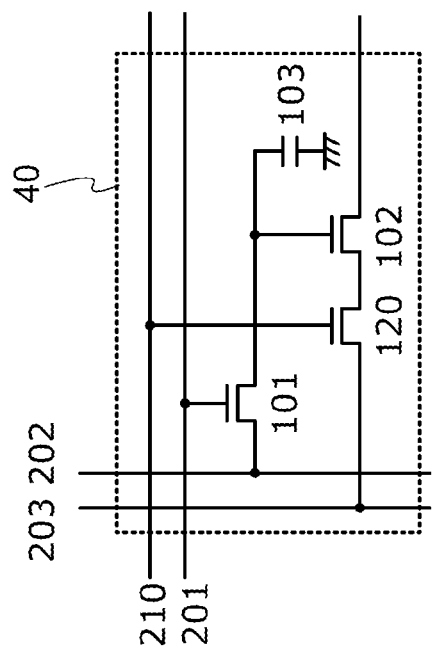
FIGS. 4A to 4D are circuit diagrams each illustrating a device structure.

Alternatively, as illustrated in FIG. 4B, the transistor 120 may be provided between the wiring 203 and the transistor 102. In this case, the gate of the transistor 120 is connected to the wiring 210, one of the source and the drain is connected to the wiring 203, and the other of the source and the drain is connected to one of the source and the drain of the transistor 102. As compared to the configuration in FIG. 4A, the configuration in FIG. 4B can suppress noise generated in the wiring 206 due to a change in the potential of the wiring 210. Thus, malfunction of a PLE and the like connected to the wiring 206 can be prevented.

Figure 4D:
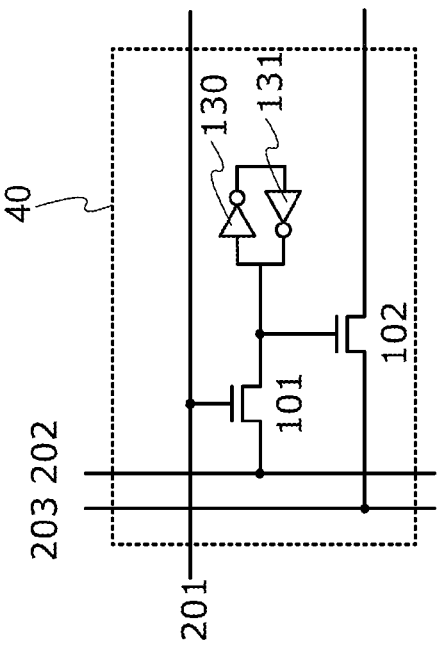
Figure 4A:
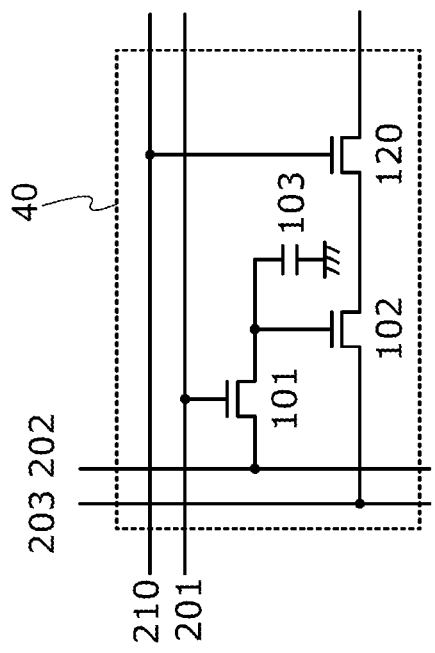
Figure 4C:
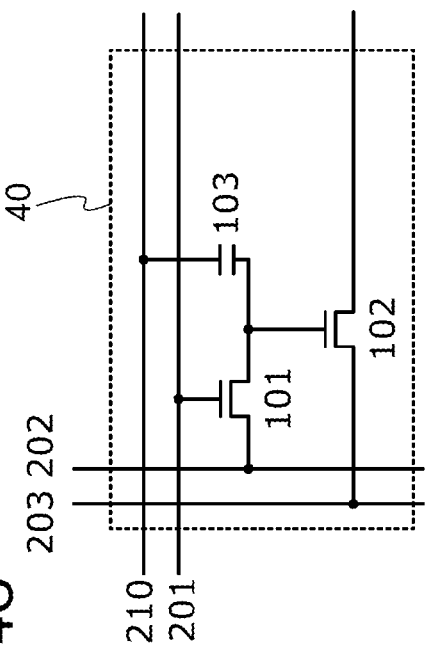

Alternatively, as illustrated in FIG. 4C, one electrode of the capacitor 103 may be connected to the wiring 210. In this case, in addition to a function of retaining the gate potential of the transistor 102, the capacitor 103 has a function of adding the amount of change in the potential of the wiring 210 to the gate potential of the transistor 102 while keeping the gate of the transistor 102 floating. The on/off state of the transistor 102 is determined depending on the potential of the wiring 210 and data stored in the cell 40.

Alternatively, as illustrated in FIG. 4D, the capacitor 103 in the cell 40 may be replaced with inverters 130 and 131. An input terminal of the inverter 130 is connected to one of the source and the drain of the transistor 101, the gate of the transistor 102, and an output terminal of the inverter 131. An output terminal of the inverter 130 is connected to an input terminal of the inverter 131. With such a configuration, variation in data stored in the cell 40 due to a change in the potential of other wirings and electrodes can be reduced. Thus, the cell 40 can be less affected by noise, so that the cell driving voltage can be lowered. Without limitation to the example using the inverters 130 and 131 in FIG. 4D, an element with a function of inverting the polarity of an input signal can be substituted for the inverters 130 and 131.

The configurations in FIGS. 4A to 4D can be applied to the cell 50 in FIG. 3.

In the transistors 101, 102, 104, 105, 107, 108, 109, 111, and 120 in FIG. 3 and FIGS. 4A to 4D, a material for a semiconductor film where a channel formation region is formed can be a variety of materials such as silicon, germanium, silicon germanium, an oxide semiconductor, and gallium nitride.

Since the transistor 101 has a function of retaining the gate potential of the transistor 102 and the transistor 104 has a function of retaining the gate potential of the transistor 105, the transistors 101 and 104 are preferably transistors with ultra-low off-state current, thereby preventing leakage of charge stored in the gate of the transistor 102 or the capacitor 103 through the transistor 101 and leakage of charge stored in the gate of the transistor 105 or the capacitor 106 through the transistor 104. Consequently, configuration data can be retained for a long time. A transistor in which a channel formation region is formed in a film of a semiconductor with a wider band gap and lower intrinsic carrier density than silicon can exhibit extremely low off-state current and thus is preferably used as the transistors 101 and 104. Examples of such a semiconductor are an oxide semiconductor and gallium nitride that have a band gap more than twice as wide as that of silicon. A transistor using such a semiconductor can have much lower off-state current than a transistor using a semiconductor such as silicon or germanium.

The use of the transistors 101 and 104 using an oxide semiconductor can prevent leakage of charge stored in the gate of the transistor 102 or the capacitor 103 and leakage of charge stored in the gate of the transistor 105 or the capacitor 106. The use of transistors containing a material other than an oxide semiconductor (e.g., silicon) as transistors except the transistors 101 and 104 achieves high-speed operation of these transistors. A transistor using an oxide semiconductor and a transistor using a material other than an oxide semiconductor are used in appropriate combination depending on intended functions; thus, both long-term data retention and high-speed circuit operation can be achieved.

In the case where a material other than an oxide semiconductor (e.g., silicon) is used for the transistors 107 and 108, the comparator circuit can operate at high speed when the circuit 12 is used as a cache memory. In contrast, in the case where an oxide semiconductor is used for the transistors 107 and 108, when the circuit 12 operates as a test circuit, the transistors 107 and 108 can be prevented from serving as a leakage path in the test circuit and the comparator circuit consumes less power.

In the case where the off-state current of the transistors 101 and 104 is extremely low, the gate of the transistor 102 when the transistor 101 is off and the gate of the transistor 105 when the transistor 104 is off are floating and highly insulated from other electrodes and wirings. Thus, the boosting effect described below is obtained. Although the cell 40 is described here, the cell 50 can obtain a similar effect.

When the gate of the transistor 102 is floating in the cell 40, as the potential of the wiring 203 changes from low level to high level, the gate potential of the transistor 102 is increased by a capacitance $C_{gs}$ generated between the source and the gate of the transistor 102 serving as a switch.

The amount of increase in the gate potential of the transistor 102 depends on the level of a potential input to the gate of the transistor 102.

Specifically, when the potential of data written to the cell 40 is low, the transistor 102 is in a weak inversion mode, so that the capacitance Cgs that contributes to an increase in the gate potential of the transistor 102 includes a capacitance Cos that is independent of the gate potential of the transistor 102. More specifically, the capacitance Cos includes an overlap capacitance generated in a region where the gate electrode and the source region overlap with each other, and a parasitic capacitance generated between the gate electrode and the source electrode, for example.

On the other hand, when the potential of data written to the cell 40 is high, the transistor 102 is in a strong inversion mode; thus, the capacitance Cgs, which contributes to an increase in the gate potential of the transistor 102, includes part of a capacitance Cox generated between a channel formation region and the gate electrode of the transistor 102, in addition to the capacitance Cos. Therefore, when the gate potential of the transistor 102 is high, the capacitance Cgs is larger than that when the gate potential of the transistor 102 is low.

Consequently, a boosting effect with which the gate potential of the transistor 102 is further increased with a change in the potential of the wiring 203 is more enhanced when the potential of data written to the cell 40 is high than when the potential is low. Thus, when the potential of data written to the cell 40 is low, the transistor 102 serving as a switch can be turned on and the switching speed of the transistor 102 can be increased. This is because the gate potential of the transistor 102 can be increased by the boosting effect even if the gate potential of the transistor 102 is lower than the potential of a signal input to the wiring 202 by the threshold voltage of the transistor 101. When the potential of data written to the cell 40 is low, the transistor 102 serving as a switch can remain off.

Next, an example of the operation of the circuit 14 illustrated in FIG. 3 will be described using a timing chart in FIG. 5.

Figure 5:
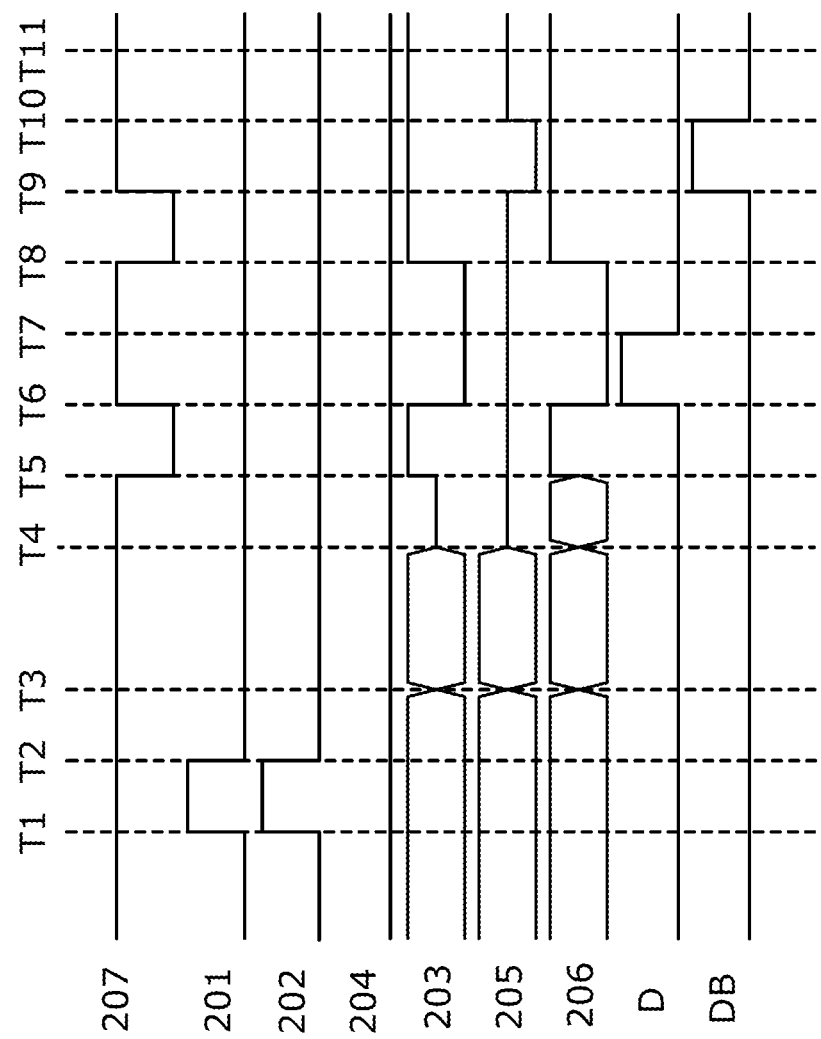
FIG. 5 is a timing chart.

In FIG. 5, in a period between time T1 and time T3, configuration data are stored in the cells 40 and 50; in a period between time T3 and T4, the circuit 12 in FIG. 1A operates as a test circuit on the basis of the configuration data; and in a period between time T5 and time T11, the circuit 12 operates as an extension circuit, specifically a cache memory.

From the time T1 to the time T2, the potential of the wiring 201 is set high, the potential of the wiring 202 is set high, and the potential of the wiring 204 is set low. Thus, the potential of the wiring 202 (high-level potential) is supplied to the gate of the transistor 102 through the transistor 101, and the potential of the wiring 204 (low-level potential) is supplied to the gate of the transistor 105 through the transistor 104. Then, from the time T2 to the time T3, the potential of the wiring 201 is set low. Thus, low-level data is stored as the second data in the gate of the transistor 105 in the cell 50, and high-level data is stored as inverted data of the second data in the gate of the transistor 102 in the cell 40.

From the time T3 to the time T4, the circuit 12 operates as a test circuit using data stored in the cells 40 and 50 as configuration data. Specifically, the transistor 102 is turned on, and electrical continuity is established between the wiring 203 and the wiring 206 through the cell 40. Furthermore, the transistor 105 is turned off, and electrical continuity between the wiring 205 and the wiring 206 is broken.

Here, the wiring D and the wiring DB are set low. The circuit 14 in which electrical continuity is established between the wiring 203 and the wiring 206 but not between the wiring 205 and the wiring 206 can be used as a test circuit.

Next, the description is made on the period between the time T5 and the time T11 during which the circuit 14 operates as a cache memory using data stored in the cells 40 and 50 as tag data.

From the time T5 to the time T6, the potential of the wiring 207 is set low. Note that when there is a PLE that supplies a signal to the wirings 203 and 205, the PLE is made to have high output impedance. At this time, the potential of the wiring 206 becomes high. The cell 40 is conducting, the cell 50 is not conducting, and the potential of the wiring 203 becomes high. Note that the expression "the cell 40 is conducting" means that electrical continuity is established between the wiring 203 and the wiring 206, and the expression "the cell 50 is conducting" means that electrical continuity is established between the wiring 205 and the wiring 206.

From the time T6 to the time T7, the wiring D is set high and the wiring DB is set low. At this time, the potential of the wiring 203 becomes low, and the potential of the wiring 206 becomes low through the cell 40. This indicates that the first data (high-level data) supplied to the wiring D and the second data (low-level data) stored in the cell 50 mismatch.

From the time T7 to the time T8, the wiring D is set low and the wiring DB is set high, whereby the wiring 206 is kept low.

From the time T8 to the time T9, the potential of the wiring 207 is set low. Note that when there is a PLE that supplies a signal to the wirings 203 and 205, the PLE is made to have high output impedance. At this time, the potential of the wiring 206 becomes high. The cell 40 is conducting, the cell 50 is not conducting, and the potential of the wiring 203 becomes high.

From the time T9 to the time T10, the wiring D is set low and the wiring DB is set high. At this time, the potential of the wiring 205 becomes low, the potential of the wiring 206 remains high, and the potential of the wiring 203 becomes low through the cell 40. This indicates that the first data (low-level data) supplied to the wiring D and the second data (low-level data) stored in the cell 50 match.

From the time T10 to the time T11, the wiring D is set low and the wiring DB is set low, whereby the wiring 206 is kept low.

As above, it is possible to configure a comparator circuit that can determine whether the first data and the second data match or not by storing the second data and inverted data of the second data in a pair of two cells (the cells 40 and 50) and supplying the first data and inverted data of the first data from the wiring D and the wiring DB. A high-order bit of an address issued by the processor is used as the first data and tag data stored in a tag field of a line of the cache memory specified by a low-order bit of the address is used as the second data, whereby the circuit 12 can serve as a tag field and a comparator circuit of the cache memory.

Note that the potential of the wiring 206 can be used directly as a coincidence signal of tag data; alternatively, the potential of the wiring 206 can be input to a PLE and an output signal of the PLE can be used as a coincidence signal. In the latter case, the wiring 206 or a wiring connected to the wiring 206 can bypass part of a logic circuit included in the PLE in order to prevent delay of signals from the wiring 206 as much as possible. In other words, the PLE can include a circuit in which an input signal from the wiring 206 bypasses part of a logic circuit and is output as an output signal.

This embodiment explains the example where the circuit 14 is used as the cache memory; however, one embodiment of the present invention is not limited to this example, and the circuit 14 can be used for a TLB tag memory or a branch predictor circuit.

In the device of one embodiment of the present invention, the circuit 12 used as a test circuit while the operating state of the circuit 11 is tested can be used as an extension circuit during normal operation of the circuit 11. Therefore, the area of a circuit that is not in use during normal operation of the circuit 11 can be reduced in the device 10.

Note that this embodiment can be implemented in combination with other embodiments as appropriate.

Embodiment 4

In this embodiment, another example of the structure of the circuit 14 illustrated in FIG. 3 will be described.

Figures 6A, 6B:
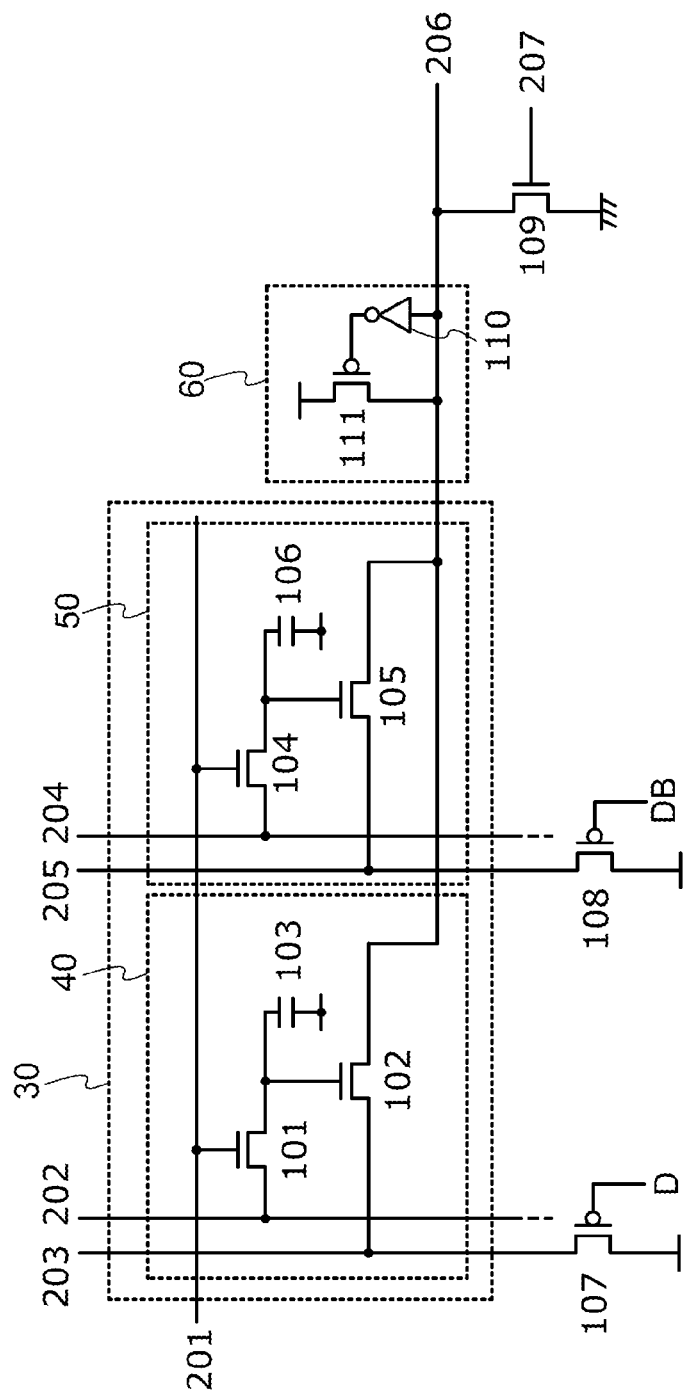
FIGS. 6A and 6B illustrate device structures.

FIG. 6A illustrates an example of the configuration of the circuit 14. This is different from the circuit 14 in FIG. 3 in that the transistors 107 and 108 are p-channel transistors, that the wiring that is supplied with a predetermined potential and connected to the transistor 107 and the wiring that is supplied with a predetermined potential and connected to the transistor 108 are high power supply lines, that the transistor 109 is an n-channel transistor, and that the wiring that is supplied with a predetermined potential and connected to the transistor 109 is a low power supply line (here, a ground line). With this structure, the circuit 14 can be used as a cache memory.

The operation of the circuit 12 functioning as a test circuit is the same as that using the circuit 14 in FIG. 3; therefore, the description is not repeated.

The operation of the circuit 12 used as a cache memory is described. First, the transistor 109 is turned on by setting the wiring 207 at a predetermined potential, whereby the potential of the wiring 206 is set low. After that, first data is input to the wiring D connected to the gate of the transistor 107, and inverted data of the first data is input to the wiring DB connected to the gate of the transistor 108. Here, assuming that second data is stored in the cell 50 and inverted data of the second data is stored in the cell 40, the potential of the wiring 206 remains low when the first data and the second data are the same and becomes high when the first data and the second data are different from each other.

As a specific example, the case where the second data is high-level data is considered, in which high-level data is stored in the cell 50 as the second data and low-level data is stored in the cell 40 as inverted data of the second data. In this case, the transistor 102 is off and the transistor 105 is on. When high-level data is supplied to the wiring D as the first data and low-level data is supplied to the wiring DB as inverted data of the first data, the transistor 107 is turned off, the transistor 108 is turned on, and electrical continuity is established between the wiring 206 and the high power supply line. Thus, the potential of the wiring 206 becomes high. This means that the first data and the second data match. In contrast, when low-level data is supplied to the wiring D as the first data and high-level data is supplied to the wiring DB as inverted data of the first data, the transistor 107 is turned on, the transistor 108 is turned off, and the potential of the wiring 206 remains low. This means that the first data and the second data mismatch.

The case where the second data is low-level data is considered, in which low-level data is stored in the cell 50 as the second data and high-level data is stored in the cell 40 as inverted data of the second data. In this case, the transistor 102 is on and the transistor 105 is off. When high-level data is supplied to the wiring D as the first data and low-level data is supplied to the wiring DB as inverted data of the first data, the transistor 107 is turned off, the transistor 108 is turned on, and the potential of the wiring 206 remains low. This means that the first data and the second data mismatch. In contrast, when low-level data is supplied to the wiring D as the first data and high-level data is supplied to the wiring DB as inverted data of the first data, the transistor 107 is turned off, the transistor 108 is turned on, and. This means that the first data and the second data match. In the case where the first data matches low-level data (i.e., the second data), when low-level data is supplied to the wiring D as the first data and high-level data is supplied to the wiring DB as inverted data of the first data, the transistor 107 is turned on, the transistor 108 is turned off, and electrical continuity is established between the wiring 206 and the high power supply line. Thus, the potential of the wiring 206 becomes high. This means that the first data and the second data match.

Accordingly, also in the circuit 14 in FIG. 6A, it is possible to configure a comparator circuit that can determine whether the first data and the second data match or not by storing the second data and inverted data of the second data in a pair of two cells (the cells 40 and 50) and supplying the first data and inverted data of the first data from the wiring D and the wiring DB. A high-order bit of an address issued by the processor is used as the first data and tag data stored in a tag field of a line of the cache memory specified by a low-order bit of the address is used as the second data, whereby the circuit 12 can serve as a tag field and a comparator circuit of the cache memory.

The circuit 14 can include a latch circuit 70 illustrated in FIG. 6B instead of the latch circuit 60. The latch circuit 70 includes inverters 112 and 113. An input terminal of the inverter 112 is connected to the wiring 206 and an output terminal thereof is connected to an input terminal of the inverter 113. An output terminal of the inverter 113 is connected to the wiring 206. With this configuration, the potential of the wiring 206 can be maintained regardless of whether it is high or low, and the wiring 206 can be prevented from being floating more effectively.

In the device of one embodiment of the present invention, the circuit 12 used as a test circuit when the operating state of the circuit 11 is tested can be used as an extension circuit during normal operation of the circuit 11. Therefore, the area of a circuit that is not in use during normal operation of the circuit 11 can be reduced in the device 10.

Note that this embodiment can be implemented in combination with other embodiments as appropriate.

Embodiment 5

In this embodiment, another example of the structure of the circuit 14 illustrated in FIG. 3 will be described.

Figure 7:
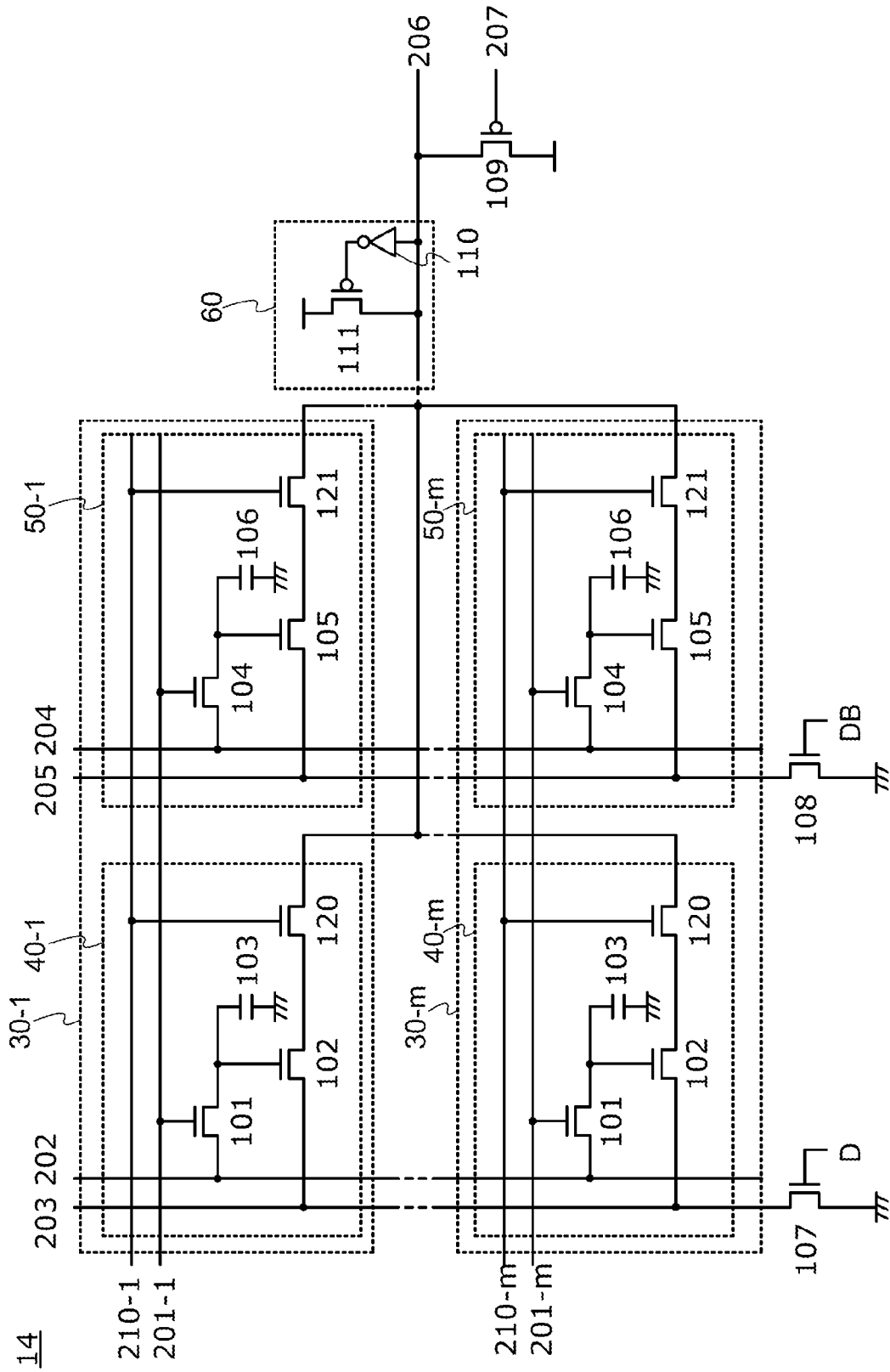
FIG. 7 is a circuit diagram illustrating a device structure.

The circuit 14 in FIG. 7 is different from the circuit 14 in FIG. 3 in including a plurality of circuits 30 having the cells 40 and 50. The other components are the same as those in FIG. 3; therefore, the description is omitted.

The circuit 14 includes circuits 30-1 to 30-$m$ ($m$ is a natural number of 2 or more). The circuits 30-1 to 30-$m$ includes the respective cells 40-1 to 40-$m$ and the respective cells 50-1 to 50-$m$. Each of the cells 40-1 to 40-$m$ includes the transistors 101, 102, and 120 and the capacitor 103. Each of the cells 50-1 to 50-$m$ includes the transistors 104 and 105, a transistor 121, and the capacitor 106. Each of the cells is connected to one of wirings 201-1 to 201-$m$ and one of wirings 210-1 to 210-$m$.

The gate of the transistor 101 in the cell 40-1 and the gate of the transistor 104 in the cell 50-1 are connected to the wiring 201-1. The gate of the transistor 101 in the cell 40-$m$ and the gate of the transistor 104 in the cell 50-$m$ are connected to the wiring 201-$m$. The gate of the transistor 120 in the cell 40-1 and the gate of the transistor 121 in the cell 50-1 are connected to the wiring 210-1. The gate of the transistor 120 in the cell 40-$m$ and the gate of the transistor 121 in the cell 50-$m$ are connected to the wiring 210-$m$. Thus, electrical continuity between the cells 40-1 to 40-$m$ and the cells 50-1 to 50-$m$ can be controlled regardless of stored configuration data, and only a specific circuit 30 can be selected from the circuits 30-1 to 30-$m$. Accordingly, the circuits 30-1 to 30-$m$ can serve as the respective lines of the cache memory, and the circuit 14 can be used as the cache memory with a plurality of lines. In this case, a high-order bit of an address and tag data can be compared for each line by controlling the potentials of the wirings 210-1 to 210-$m$ to select a specific circuit 30 from the circuits 30-1 to 30-$m$.

Next, an example of the operation of the circuit 14 in FIG. 7 will be described with reference to FIG. 8.

Figure 8:
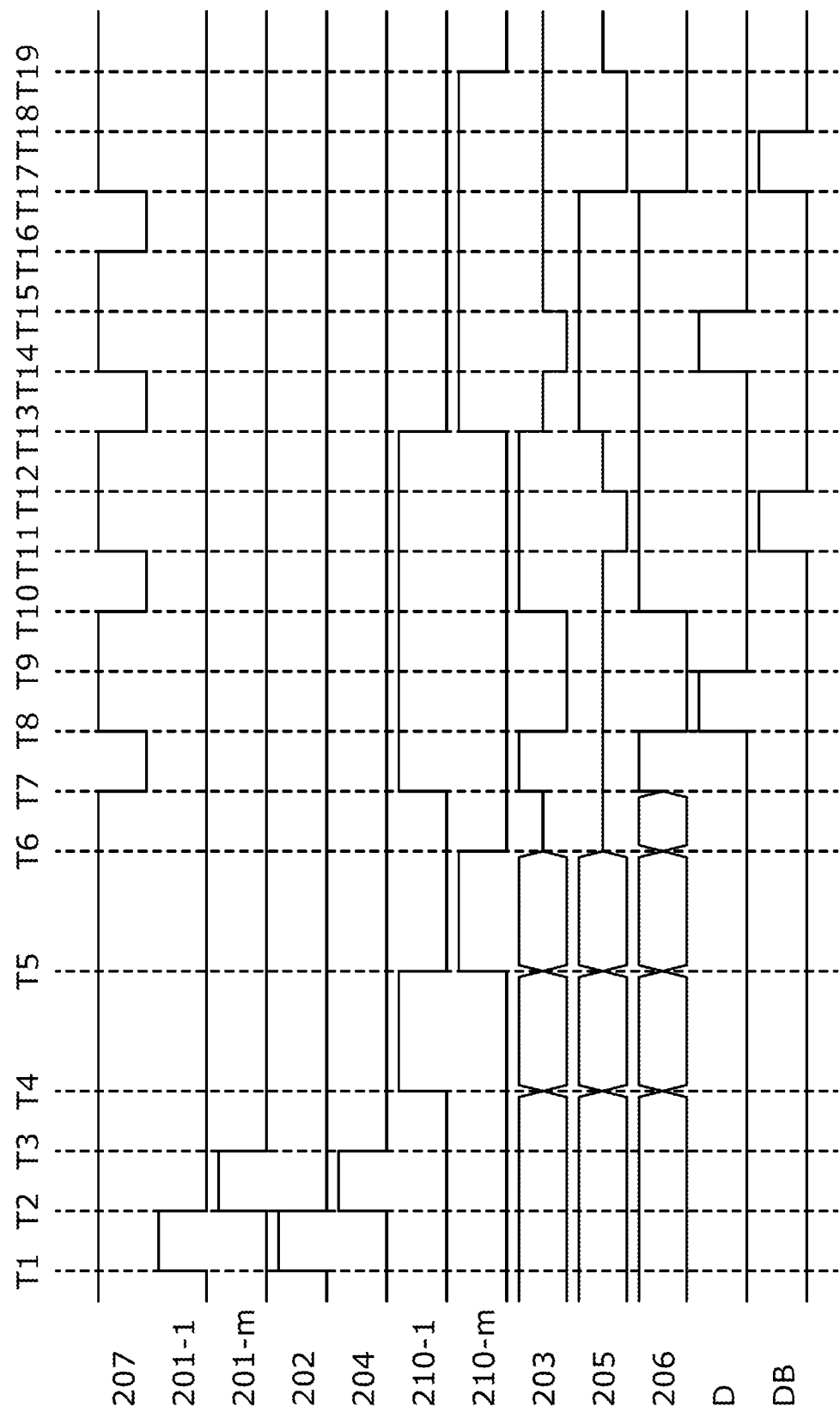
FIG. 8 is a timing chart.

In FIG. 8, in a period between time T1 and time T3, configuration data are stored in the cells 40 and 50; in a period between time T4 and T6, the circuit 12 in FIG. 1A operates as a test circuit on the basis of the configuration data; and in a period between time T7 and time T19, the circuit 12 operates as an extension circuit, specifically a cache memory.

First, the period between the time T1 and the time T3 for storing data in the cells 40 and 50 will be described.

From the time T1 to the time T2, the potential of the wiring 201-1 is set high, the potential of the wiring 202 is set high, and the potential of the wiring 204 is set low. Thus, the potential of the wiring 202 (high-level potential) is supplied to the gate of the transistor 102 through the transistor 101 in the cell 40-1, and the potential of the wiring 204 (low-level potential) is supplied to the gate of the transistor 105 through the transistor 104 in the cell 50-1. Accordingly, low-level data is stored as the second data in the gate of the transistor 105 in the cell 50-1, and high-level data is stored as inverted data of the second data in the gate of the transistor 102 in the cell 40-1.

From the time T2 to the time T3, the potential of the wiring 201-1 is set low, the potential of the wiring 201-$m$ is set high, the potential of the wiring 202 is set low, and the potential of the wiring 204 is set high. Thus, the potential of the wiring 202 (low-level potential) is supplied to the gate of the transistor 102 through the transistor 101 in the cell 40-$m$, and the potential of the wiring 204 (high-level potential) is supplied to the gate of the transistor 105 through the transistor 104 in the cell 50-$m$. Accordingly, high-level data is stored as the second data in the gate of the transistor 105 in the cell 50-$m$, and low-level data is stored as inverted data of the second data in the gate of the transistor 102 in the cell 40-$m$.

Next, the period between the time T4 and the time T6 during which the circuit 12 in FIG. 1A operates as a test circuit will be described. Here, the wiring D and the wiring DB are set low.

From the time T4 to the time T5, the potential of the wiring 210-1 is set high and the potential of the wiring 210-$m$ is set low. At this time, the transistor 120 in the cell 40-1 and the transistor 121 in the cell 50-1 are turned on. Here, the transistor 102 in the cell 40-1 is on, the transistor 105 in the cell 50-1 is off, and electrical continuity is established between the wiring 203 and the wiring 206 through the cell 40-1.

From the time T5 to the time T6, the potential of the wiring 210-1 is set low and the potential of the wiring 210-$m$ is set high. At this time, the transistor 120 in the cell 40-$m$ and the transistor 121 in the cell 50-$m$ are turned on. Here, the transistor 102 in the cell 40-$m$ is off, the transistor 105 in the cell 50-$m$ is on, and electrical continuity is established between the wiring 205 and the wiring 206 through the cell 50-$m$.

The circuit 14 in which electrical continuity is established between the wiring 203 and the wiring 206 through the cell 40-1 and between the wiring 205 and the wiring 206 through the cell 50-$m$ as described above can be used as a test circuit.

Next, the description is made on the period between the time T7 and the time T19 during which the circuit 14 operates as a cache memory using data stored in the cells 40 and 50 as tag data.

From the time T7 to the time T8, the potential of the wiring 210-1 is set high, the potential of the wiring 210-$m$ is set low, and the potential of the wiring 207 is set low. Note that when there is a PLE that supplies a signal to the wirings 203 and 205, the PLE is made to have high output impedance. At this time, the potential of the wiring 206 becomes high. The cell 40-1 is conducting and the cell 50-1 is not conducting, so that the potential of the wiring 203 becomes high.

From the time T8 to the time T9, the wiring D is set high and the wiring DB is set low. At this time, the potential of the wiring 203 becomes low. Since the transistors 102 and 120 are on, the potential of the wiring 206 becomes low. This indicates that the first data (high-level data) supplied to the wiring D and the second data (low-level data) stored in the cell 50-1 mismatch.

From the time T9 to the time T10, the potential of the wiring D is set low and the potential of the wiring DB is set high, whereby the potential of the wiring 206 is kept low.

From the time T10 to the time T11, the potential of the wiring 210-1 is set high, the potential of the wiring 210-$m$ is set low, and the potential of the wiring 207 is set low. Note that when there is a PLE that supplies a signal to the wirings 203 and 205, the PLE is made to have high output impedance. At this time, the potential of the wiring 206 becomes high. The cell 40 is conducting and the cell 50 is not conducting, so that the potential of the wiring 203 becomes high.

From the time T11 to the time T12, the wiring D is set low and the wiring DB is set high. At this time, the potential of the wiring 205 becomes low. Since the potential of the wiring 206 is kept high and the transistors 102 and 120 in the cell 40-1 are on, the potential of the wiring 203 is high. This indicates that the first data (low-level data) supplied to the wiring D and the second data (low-level data) stored in the cell 50-1 match.

From the time T12 to the time T13, the potential of the wiring D is set low and the potential of the wiring DB is set low, whereby the potential of the wiring 206 is kept high.

From the time T13 to the time T14, the potential of the wiring 210-1 is set low, the potential of the wiring 210-$m$ is set high, and the potential of the wiring 207 is set low. Note that when there is a PLE that supplies a signal to the wirings 203 and 205, the PLE is made to have high output impedance. At this time, the potential of the wiring 206 becomes high. Since the cell 50-$m$ is conducting and the cell 40-$m$ is not conducting, the potential of the wiring 205 becomes high.

From the time T14 to the time T15, the wiring D is set high and the wiring DB is set low. At this time, the potential of the wiring 203 becomes low. Since the potential of the wiring 206 is kept high and the transistors 105 and 121 in the cell 50-*m* are on, the potential of the wiring 205 is high. This indicates that the first data (high-level data) supplied to the wiring D and the second data (high-level data) stored in the cell 50-*m* match.

From the time T15 to the time T16, the wiring D is set low and the wiring DB is set low, whereby the wiring 206 remains high.

From the time T16 to the time T17, the potential of the wiring 210-1 is set low, the potential of the wiring 210-*m* is set high, and the potential of the wiring 207 is set low. Note that when there is a PLE that supplies a signal to the wirings 203 and 205, the PLE is made to have high output impedance. At this time, the potential of the wiring 206 becomes high. Since the cell 50-*m* is conducting and the cell 40-*m* is not conducting, the potential of the wiring 205 becomes high.

From the time T17 to the time T18, the wiring D is set low and the wiring DB is set high. At this time, the potential of the wiring 205 is low. Since the transistors 105 and 121 in the cell 50-*m* are on, the potential of the wiring 206 becomes low. This indicates that the first data (low-level data) supplied to the wiring D and the second data (high-level data) stored in the cell 50-*m* mismatch.

From the time T18 to the time T19, the wiring D is set low and the wiring DB is set low, whereby the wiring 206 is kept low.

As above, it is possible to configure a comparator circuit that can determine whether the first data and the second data match or not by storing the second data and inverted data of the second data in a pair of two cells (the cells 40 and 50) and supplying the first data and inverted data of the first data from the wiring D and the wiring DB. A high-order bit of an address issued by the processor is used as the first data and tag data stored in a tag field of a line of the cache memory specified by a low-order bit of the address is used as the second data, whereby the circuit 12 can serve as a tag field and a comparator circuit of the cache memory.

This embodiment explains the example where the circuit 14 is used as the cache memory; however, one embodiment of the present invention is not limited to this example, and the circuit 14 can be used for a TLB tag memory or a branch predictor circuit.

In the device of one embodiment of the present invention, the circuit 12 used as a test circuit when the operating state of the circuit 11 is tested can be used as an extension circuit during normal operation of the circuit 11. Consequently, the area of a circuit that is unnecessary during normal operation of the circuit 11 can be reduced in the device 10.

Note that this embodiment can be implemented in combination with other embodiments as appropriate.

Embodiment 6

In this embodiment, another example of the structure of the circuit 14 in FIG. 3 will be described.

Figure 9:
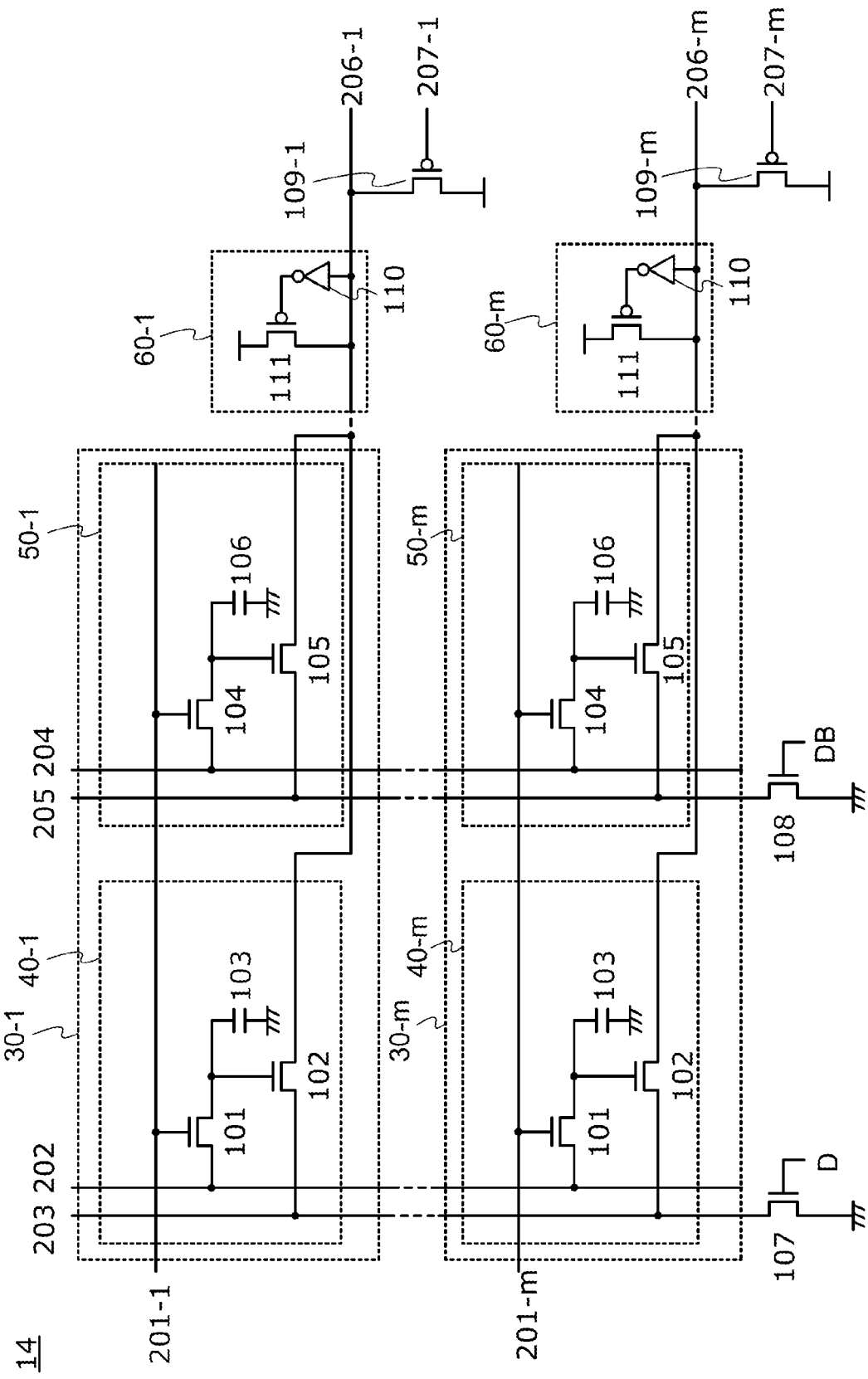
FIG. 9 is a circuit diagram illustrating a device structure.

The circuit 14 in FIG. 9 is different from the circuit 14 in FIG. 3 in including a plurality of circuits 30 having the cells 40 and 50 and a plurality of wirings 206 connected to the circuits 30. The other components are the same as those in FIG. 3; therefore, the description is omitted.

The circuit 14 in FIG. 9 includes the circuits 30-1 to 30-*m*. The circuits 30-1 to 30-*m* includes the respective cells 40-1 to 40-*m* and the respective cells 50-1 to 50-*m*. Each of the cells 40-1 to 40-*m* includes the transistors 101 and 102 and the capacitor 103. Each of the cells 50-1 to 50-*m* includes the transistors 104 and 105 and the capacitor 106. Each of the cells is connected to one of the wirings 201-1 to 201-*m*.

Moreover, the circuit 14 includes a plurality of wirings 206 each of which is connected to a corresponding one of the circuits 30. Specifically, the circuit 14 includes the circuits 30-1 to 30-*m* and the wirings 206-1 to 206-*m*, the circuit 30-1 is connected to the wiring 206-1, and the circuit 30-*m* is connected to the wiring 206-*m*. The wiring 206-1 is connected to a latch circuit 60-1 and a transistor 109-1. The wiring 206-*m* is connected to a latch circuit 60-*m* and a transistor 109-*m*. A gate of the transistor 109-1 is connected to a wiring 207-1. A gate of the transistor 109-*m* is connected to a wiring 207-*m*. Note that the configurations of the cells 40-1 to 40-*m*, the cells 50-1 to 50-*m*, and the latch circuits 60-1 to 60-*m* are the same as those of the cells 40 and 50 and the latch circuit 60 in FIG. 3; thus, the description is omitted.

The circuit 14 with the configuration in FIG. 9 can be used as the cache memory with a plurality of lines by using each of the circuits 30-1 to 30-*m* as a line of the cache memory. With the wiring 206-1 connected to the circuit 30-1 and the wiring 206-*m* connected to the circuit 30-*m*, it is possible to configure a plurality of comparator circuits that determine whether the first data and the second data match or not, and signals from the wirings 206-1 to 206-*m* can be used as coincidence signals for each row. Thus, when a high-order bit of an address to which access is requested by the processor is input to the wiring D as the first data, whether data corresponding to the address is stored in the lines or not can be detected at a time. In this case, the circuit 14 can be used as a tag memory of a fully associative cache memory or a CAM in a branch predictor circuit.

In the device of one embodiment of the present invention, the circuit 12 used as a test circuit when the operating state of the circuit 11 is tested can be used as an extension circuit during normal operation of the circuit 11. Consequently, the area of a circuit that is not in use during normal operation of the circuit 11 can be reduced in the device 10.

Note that this embodiment can be implemented in combination with other embodiments as appropriate.

Embodiment 7

In this embodiment, an example of a more specific structure of the circuit 14 shown in Embodiments 1 to 6 will be described.

Figure 10:
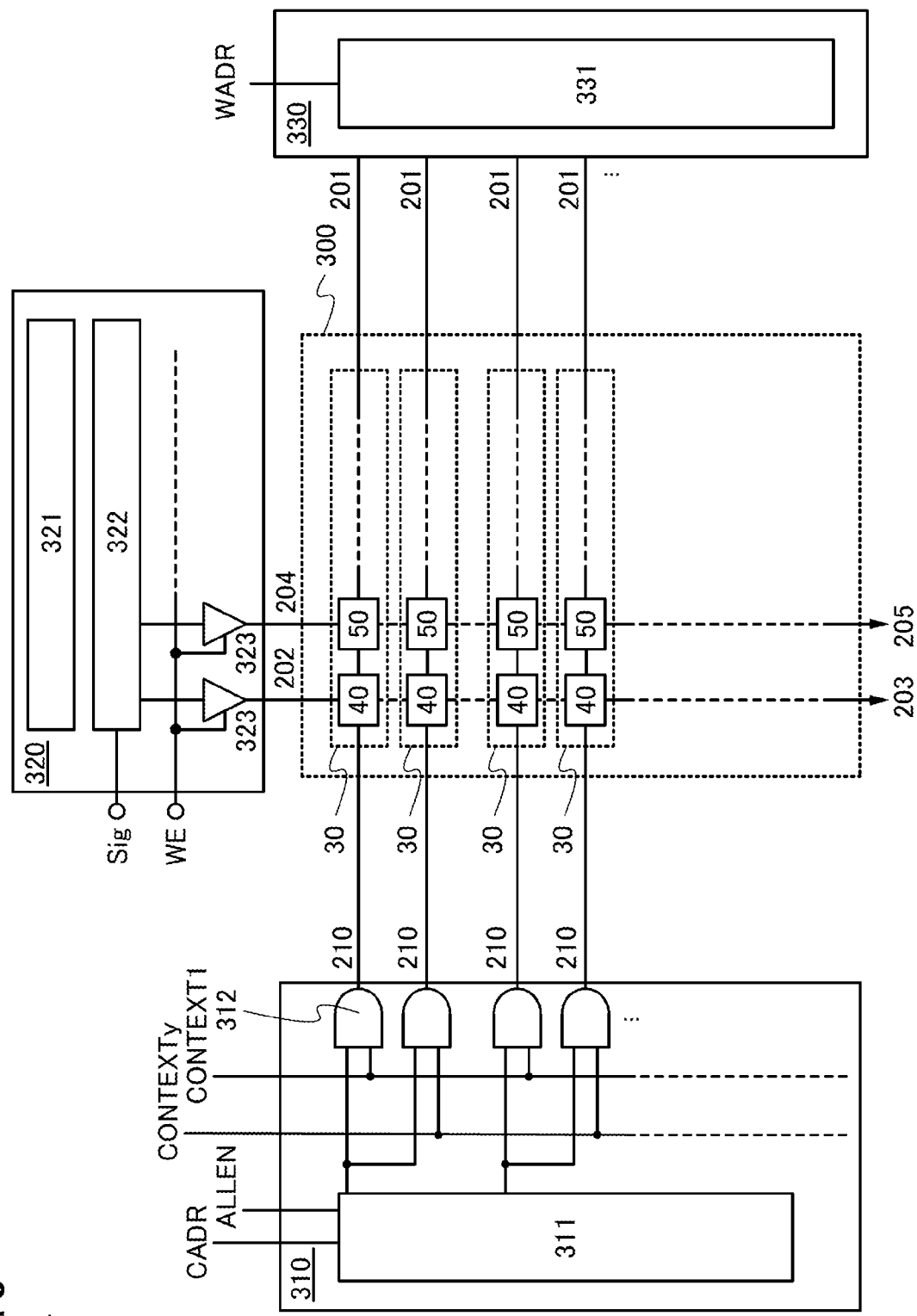
FIG. 10 is a circuit diagram illustrating a device structure.

The circuit 14 illustrated in FIG. 10 includes a cell array 300 having the configuration illustrated in any of FIG. 3, FIGS. 4A to 4D, and FIGS. 6, 7, and 9; a driver circuit 310 having a function of controlling supply of a potential to the wiring 210; a driver circuit 320 having a function of controlling supply of a signal including data to the wirings 202 and 204; and a driver circuit 330 having a function of controlling supply of a potential to the wiring 201.

The driver circuit 320 includes a circuit 321 that is composed of a shift register, a decoder, or the like and has a function of controlling timing of sampling of a signal Sig containing data; a circuit 322 that has a function of sampling the signal Sig at the timing determined by the circuit 321; and a plurality of switches 323 that have a function of controlling supply of the sampled signal to the wirings 202 and 204. FIG. 10 illustrates an example where the switch 323 is a three-state buffer, whose output becomes high impedance in accordance with a signal WE.

Specifically, in FIG. 10, when the potential of the signal WE is high, the switches 323 supply signals with the same logic levels as signals input to their input terminals to the wirings 202 and 204. On the other hand, when the potential of the signal WE is low, the switches 323 have high impedance and the signals input to the input terminals are not supplied to the wirings 202 and 204.

When the circuit 14 is used as a cache memory, the driver circuit 320 is preferably configured to supply data to the cell array 300 in parallel in accordance with the data width of the cache memory as illustrated in FIG. 10.

The driver circuit 310 controls the potentials of the wirings 210 to select one circuit 30 that determines the connection between the wirings 203 and 205 and one wiring 206 (see FIGS. 3, 6, 7, and 9) from the circuits 30 included in the cell array 300. Furthermore, the driver circuit 310 controls the potentials of the wirings 210 to select one circuit 30 from which data is read out, from the circuits 30 included in the cell array 300.

Specifically, the driver circuit 310 in FIG. 10 includes a circuit 311 having a function of generating a signal for selecting some circuits 30 from the plurality of circuits 30, and a plurality of circuits 312 having a function of selecting one circuit 30 from the selected circuits 30 in accordance with signals input to wirings CONTEXT1 to CONTEXTy. An example of the circuit 311 is a decoder, and an example of the circuit 312 is an AND circuit.

To select one circuit 30 from the circuits 30 that store data containing a circuit configuration by the driver circuit 310 in FIG. 10, the potentials of all signals output from the circuit 311 are set high and the potential of only the wiring CONTEXT corresponding to the one circuit 30 to be selected among the wirings CONTEXT1 to CONTEXTy is set high. In the example of FIG. 10, whether the potentials of all the signals output from the circuit 311 are set high is determined in accordance with a potential supplied from a wiring ALLEN to the circuit 311.

When one circuit 30 is selected, the connection between one wiring 206 and the wirings 203 and 205 is determined. When the transistor 109 illustrated in FIG. 3 or the like is turned on and a predetermined potential is supplied to the wiring 206 while one circuit 30 is selected by the driver circuit 310, data of the selected circuit 30 can be output to the wirings 203 and 205.

In the driver circuit 310 illustrated in FIG. 10, when a signal that is supplied from a wiring CADR and contains an address as data is decoded by the circuit 311, one circuit 30 from which data is read out is selected from the circuits 30.

The driver circuit 330 controls the potentials of wirings 201 to select one circuit 30 to which data is input, from the circuits 30 included in the cell array 300. The driver circuit 330 in FIG. 10 specifically includes a circuit 331 with a function of generating a signal for selecting one circuit 30 from the circuits 30. As the circuit 331, a decoder can be used, for example. To select one circuit 30 by the driver circuit 330 in FIG. 10, a signal containing an address as data, which is supplied from a wiring WADR, is decoded by the circuit 331.

Note that this embodiment can be implemented in combination with other embodiments as appropriate.

Embodiment 8

In this embodiment, an example of a specific structure of the circuit 12 illustrated in FIGS. 1A to 1C will be described.

Figure 11A:
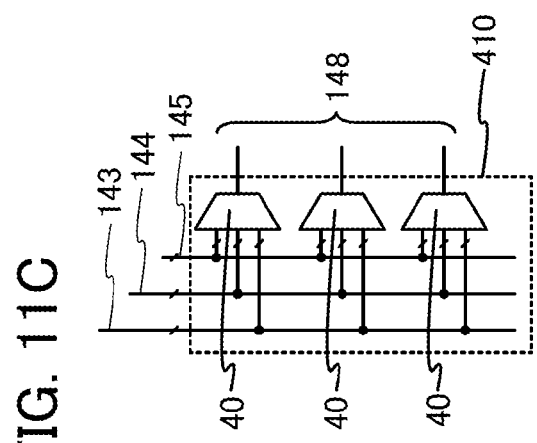
FIGS. 11A to 11C are circuit diagrams each illustrating a device structure.

FIG. 11A illustrates an example of part of the configuration of the circuit 12. In FIG. 11A, the circuit 12 includes a first column 80-1 including circuits 15, a second column 80-2 including circuits 15, and a third column 80-3 including circuits 15. FIG. 11A illustrates an example where the first column 80-1, the second column 80-2, and the third column 80-3 are positioned in parallel in this order from the left.

The circuit 12 also includes a plurality of wirings 142, a plurality of wirings 143, a plurality of wirings 144, a plurality of wirings 145, a plurality of wirings 146, a plurality of wirings 147, and a plurality of wirings 148.

A first output terminal of each circuit 15 in the first column 80-1 is electrically connected to one of the wirings 142. A second output terminal of each circuit 15 in the first column 80-1 is electrically connected to one of the wirings 143.

A first output terminal of each circuit 15 in the second column 80-2 is electrically connected to one of the wirings 145. A second output terminal of each circuit 15 in the second column 80-2 is electrically connected to one of the wirings 146.

A first output terminal of each circuit 15 in the third column 80-3 is electrically connected to one of the wirings 144. A second output terminal of each circuit 15 in the third column 80-3 is electrically connected to one of the wirings 148.

Note that the number of the first output terminals and the number of the second output terminals of each circuit 15 are not limited to one, and either or both of the number of the first output terminals and the number of the second output terminals may be more than one. Note also that one output terminal is always connected to one wiring regardless of the number of the first output terminals and the number of the second output terminals. Thus, when one column includes Y circuits 15 (Y is a natural number), the circuit 12 at least includes Y wirings connected to the first output terminals and Y wirings connected to the second output terminals.

The first column 80-1 is placed between the wirings 142 and the wirings 143. The second column 80-2 is placed between the wirings 145 and the wirings 146. The third column 80-3 is placed between the wirings 144 and the wirings 148.

The wirings 145, which are connected to the first output terminals of the circuits 15 in the second column 80-2, are provided both between the first column 80-1 and the second column 80-2 and between the first column 80-1 and a column (not illustrated) of the circuits 15 positioned on the left side of the first column 80-1 in FIG. 11A. The wirings 144, which are connected to the first output terminals of the circuits 15 in the third column 80-3, are provided both between the first column 80-1 and the second column 80-2 and between the second column 80-2 and the third column 80-3. The wirings 147, which are connected to the first output terminals of the circuits 15 (not illustrated) positioned on the right side of the third column 80-3 in FIG. 11A, are provided both between the second column 80-2 and the third column 80-3 and between the third column 80-3 and a column (not illustrated) of the circuits 15 positioned on the right side of the third column 80-3.

When attention is focused on an N-th column (N is a natural number of 3 or more), a plurality of wirings connected to the first output terminals of the circuits 15 in the N-th column are provided both between the N-th column and an (N−1)th column and between the (N−1)th column and an (N−2)th column. In the case where N is 2, a plurality of wirings electrically connected to the first output terminals of the circuits 15 in the second column are provided both between the second column and the first column and between the first column and an I/O. The I/O functions as an interface that controls input of signals to the circuits 15 from the outside of the circuit 12 or output of signals from the circuits 15 to the outside of the circuit 12.

In one embodiment of the present invention, when attention is focused on the (N−1)th column (N is a natural number of 3 or more), wirings electrically connected to the first output terminals of the circuits 15 in the (N−1)th column, wirings electrically connected to the first output terminals of the circuits 15 in the N-th column, and wirings electrically connected to the second output terminals of the circuits 15 in the (N−2)th column are electrically connected to the input terminals of the circuits 15 in the (N−1)th column through circuits 410.

Specifically, in FIG. 11A, for example, the wirings 145 electrically connected to the first output terminals of the circuits 15 in the second column 80-2, the wirings 144 electrically connected to the first output terminals of the circuits 15 in the third column 80-3, and the wirings 143 electrically connected to the second output terminals of the circuits 15 in the first column 80-1 are electrically connected to the input terminals of the circuits 15 in the second column 80-2 through the circuits 410.

Figure 11B:
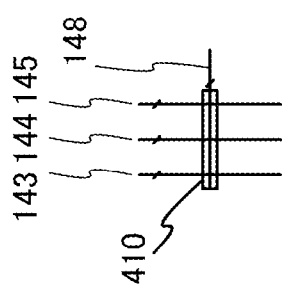

FIG. 11B is a circuit diagram of the circuit 410 that controls electrical connection between the wirings 143, 144, and 145 and the input terminals of the circuits 15 in the second column 80-2 illustrated in FIG. 11A. In FIG. 11B, a plurality of wirings 148 are electrically connected to a plurality of input terminals of the circuit 15 in the second column 80-2.

Figure 11C:
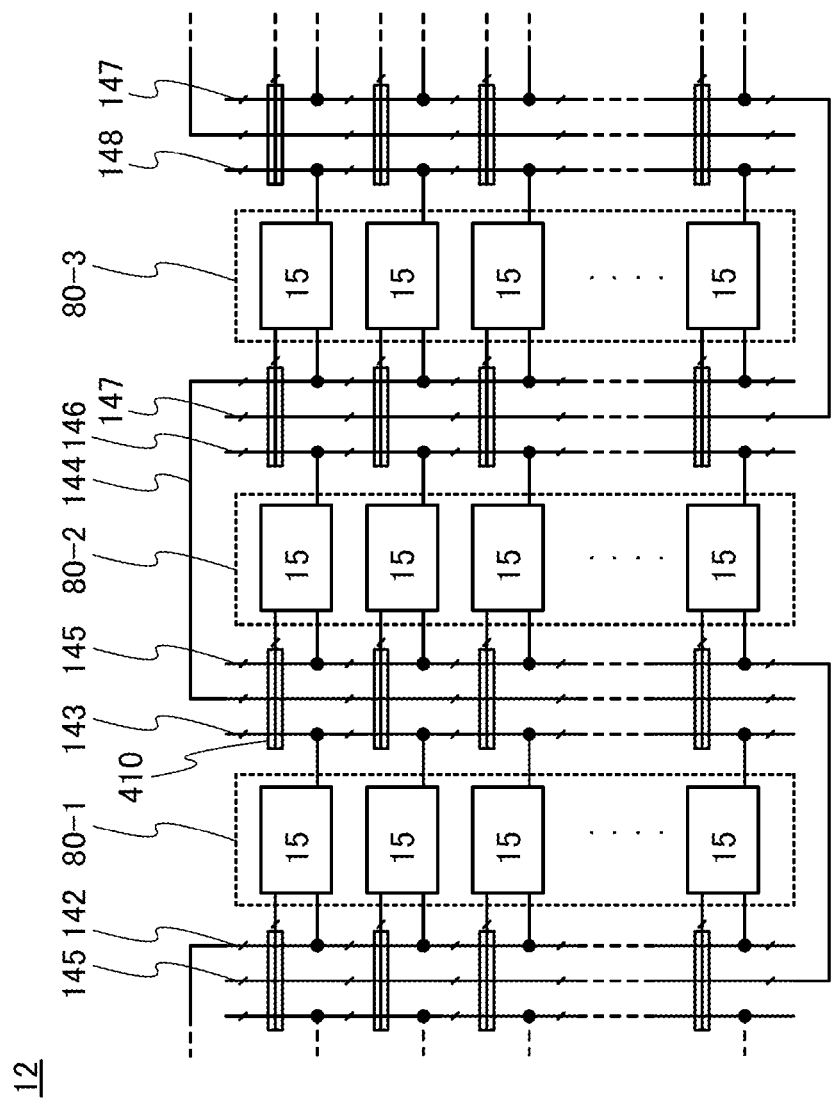

The circuit 410 includes a plurality of circuits 14 with the configuration illustrated in any of FIGS. 3, 6, 7, and 9. FIG. 11C illustrates a specific configuration example of the circuit 410 illustrated in FIG. 11B. The circuit 410 in FIG. 11B includes three cells 40 as illustrated in FIG. 11C.

The circuit 410 in FIG. 11C is connected to three wirings 148 and thus includes three cells 40. The number of cells 40 included in the circuit 410 can be determined in accordance with the number of input terminals of the circuit 15.

As a typical example, FIGS. 11B and 11C illustrate the circuit 410 that controls electrical connection between the wirings 143, 144, and 145 and the wirings 148; other circuits 410 that control electrical connection between a group of wirings and another group of wirings in FIG. 11A have a structure similar to the above.

Figure 12:
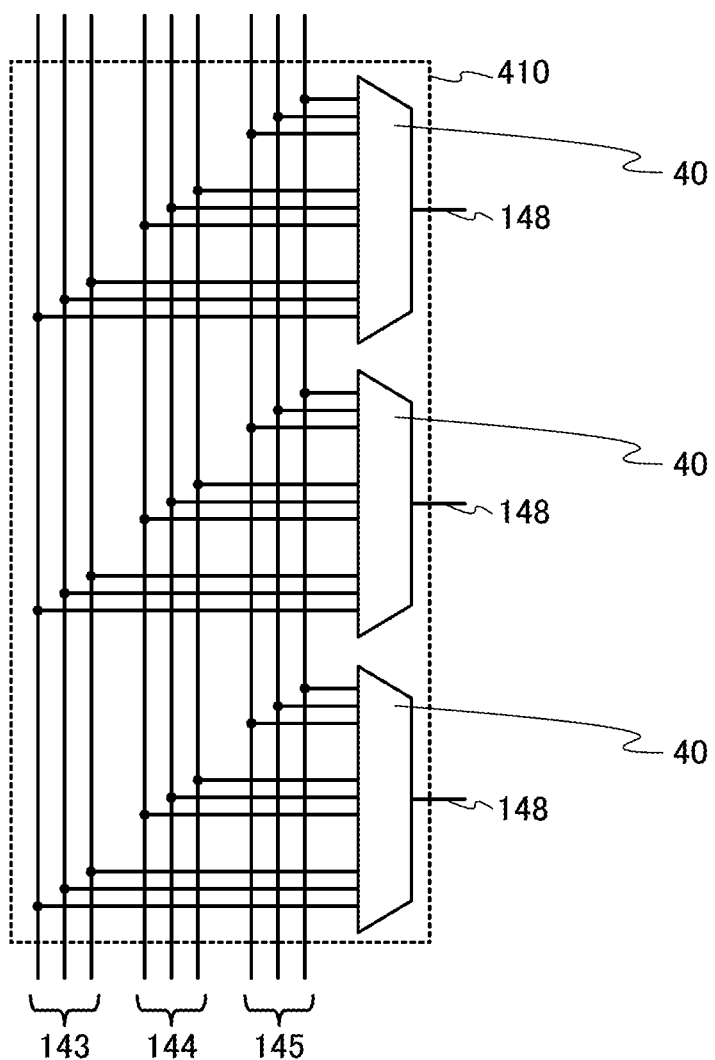
FIG. 12 is a circuit diagram illustrating a device structure.

FIG. 12 illustrates a more specific configuration example of the circuit 410 in FIG. 11C. FIG. 12 shows the details of the connection relation between the wirings 143, 144, and 145 and the circuit 410. As illustrated in FIG. 12, each of the cells 40 controls electrical continuity between all the wirings 143, 144, and 145 and one of the wirings 148.

When the circuit 14 illustrated in any of FIGS. 3, 6, 7, and 9 is employed in FIG. 12, the plurality of wirings 143 to 145 in FIG. 12 correspond to the wirings 203, 205, and the like and the wiring 148 in FIG. 12 corresponds to the wiring 206. In addition, the cell 40 in FIG. 11C can be replaced with the cell 50.

As described above, in one embodiment of the present invention, one of a plurality of wirings electrically connected to the output terminal of the circuit 15, such as the wirings 143, 144, and 145, is selected in accordance with data stored in the cells 40 and 50, and the one selected wiring and another wiring electrically connected to the input terminal of another circuit 15, such as the wiring 148, are electrically connected to each other by the circuit 14. Furthermore, in one embodiment of the present invention, the circuits 410 including the circuits 14 with the above configuration and the aforementioned various wirings whose electrical continuity is controlled by the circuits 410 are provided between columns having the circuits 15, such as the first column 80-1, the second column 80-2, and the third column 80-3. Thus, in the circuit 12 illustrated in FIG. 11A, electrical continuity between two circuits 15 in the second column 80-2 can be controlled by the circuit 14. Electrical continuity between one of the circuits 15 in the first column 80-1 and one of the circuits 15 in the second column 80-2 can be controlled by the circuit 14. Electrical continuity between one of the circuits 15 in the second column 80-2 and one of the circuits 15 in the third column 80-3 can be controlled by the circuit 14. Accordingly, one embodiment of the present invention can achieve the circuit 12 that needs a small number of switches to control electrical continuity between the cells 40 and 50 while having high design flexibility.

Note that this embodiment can be implemented in combination with other embodiments as appropriate.

Embodiment 9

In this embodiment, an example of a specific structure of the circuit 13 illustrated in FIGS. 1A to 1C will be described.

Figure 13A:
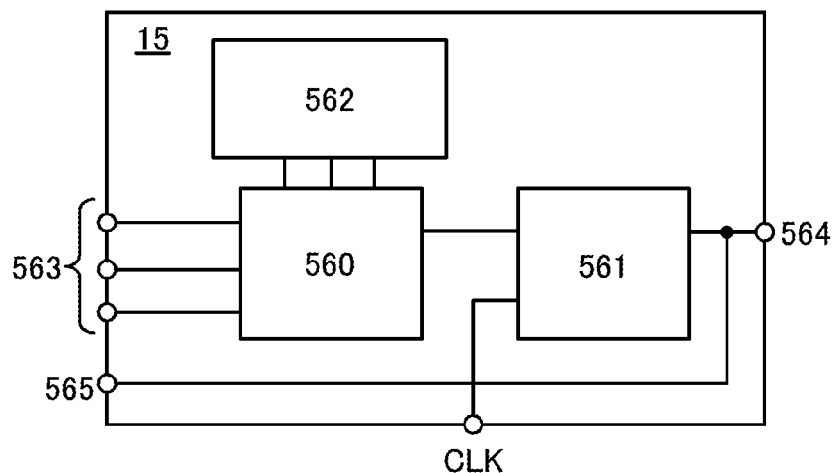
FIGS. 13A to 13C are circuit diagrams each illustrating a device structure.

FIG. 13A illustrates one embodiment of the circuit 15. The circuit 15 illustrated in FIG. 13A includes a look-up table (LUT) 560, a flip-flop 561, and a memory device 562. The kind of logic operation of the LUT 560 is determined in accordance with data stored in the memory device 562. Specifically, in the LUT 560, the logical value of an output signal with respect to the logical values of input signals supplied to input terminals 563 is determined according to the data. Then, the LUT 560 outputs a signal containing the logical value of the output signal. The flip-flop 561 holds the signal output from the LUT 560 and outputs an output signal corresponding to the signal from a first output terminal 564 and a second output terminal 565 in synchronization with a clock signal CLK.

Note that it is possible that the circuit 15 includes a multiplexer and whether the output signal from the LUT 560 passes through the flip-flop 561 or not is selected by the multiplexer.

The type of the flip-flop 561 may be determined by data. Specifically, the flip-flop 561 may function as any of a D flip-flop, a T flip-flop, a JK flip-flop, and an RS flip-flop in accordance with the data.

Figure 13B:
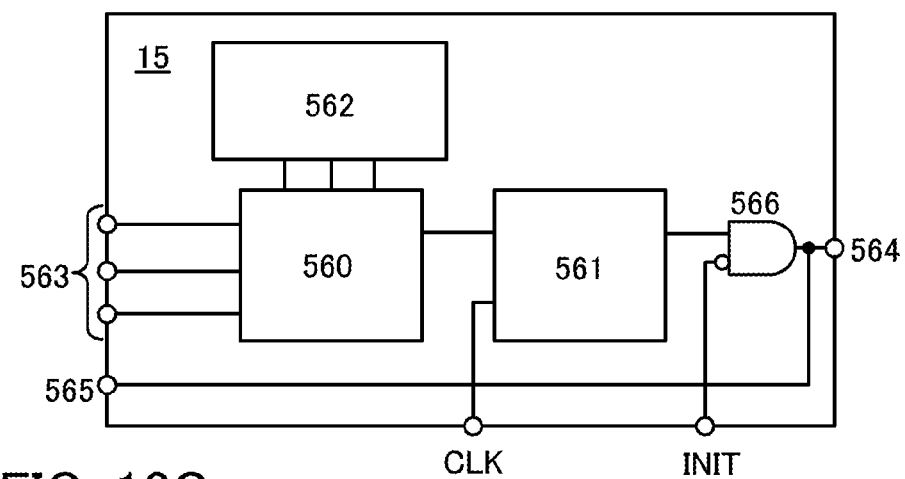

FIG. 13B illustrates another embodiment of the circuit 15. The circuit 15 illustrated in FIG. 13B includes an AND circuit 566 in addition to the components of the circuit 15 in FIG. 13A. To the AND circuit 566, a signal from the flip-flop 561 is supplied as an active high input, and the potential of the wiring 207 for initializing the potential of the wiring 206 (illustrated in FIGS. 3, 6, 7, and 9) is supplied as an active low input. With the above configuration, when the potential of the wiring 206 is initialized in accordance with the potential of the wiring 207, a wiring to which an output signal from the circuit 15 is supplied can be initialized with the use of the potential of a power supply line connected to the transistor 109 (illustrated in FIGS. 3, 6, 7, and 9). Consequently, a large amount of current can be prevented from flowing between the circuits 15, so that breakage of the circuit 12 can be prevented.

Figure 13C:
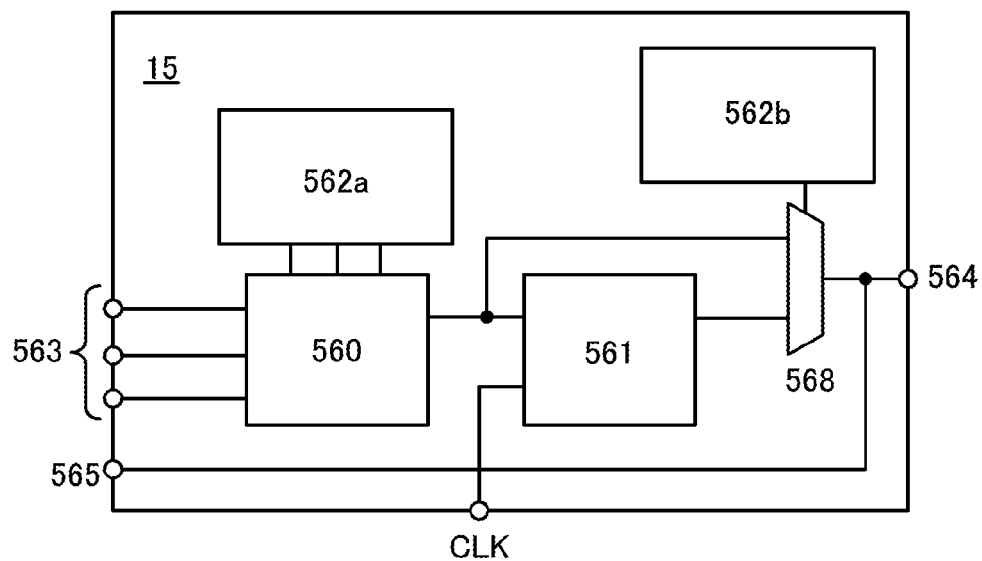

FIG. 13C illustrates another embodiment of the circuit 15. The circuit 15 illustrated in FIG. 13C includes a multiplexer 568 in addition to the components of the circuit 15 in FIG. 13A. The circuit 15 in FIG. 13C also includes two memory devices 562 (memory devices 562*a* and 562*b*). The kind of logic operation of the LUT 560 is determined according to data stored in the memory device 562*a*. A signal output from the LUT 560 and a signal output from the flip-flop 561 are input to the multiplexer 568. The multiplexer 568 has a function of selecting and outputting one of the two output signals in accordance with data stored in the memory device 562b. The output signal of the multiplexer 568 is output from the first output terminal 564 and the second output terminal 565.

Note that this embodiment can be implemented in combination with other embodiments as appropriate.

Embodiment 10

Figure 14:
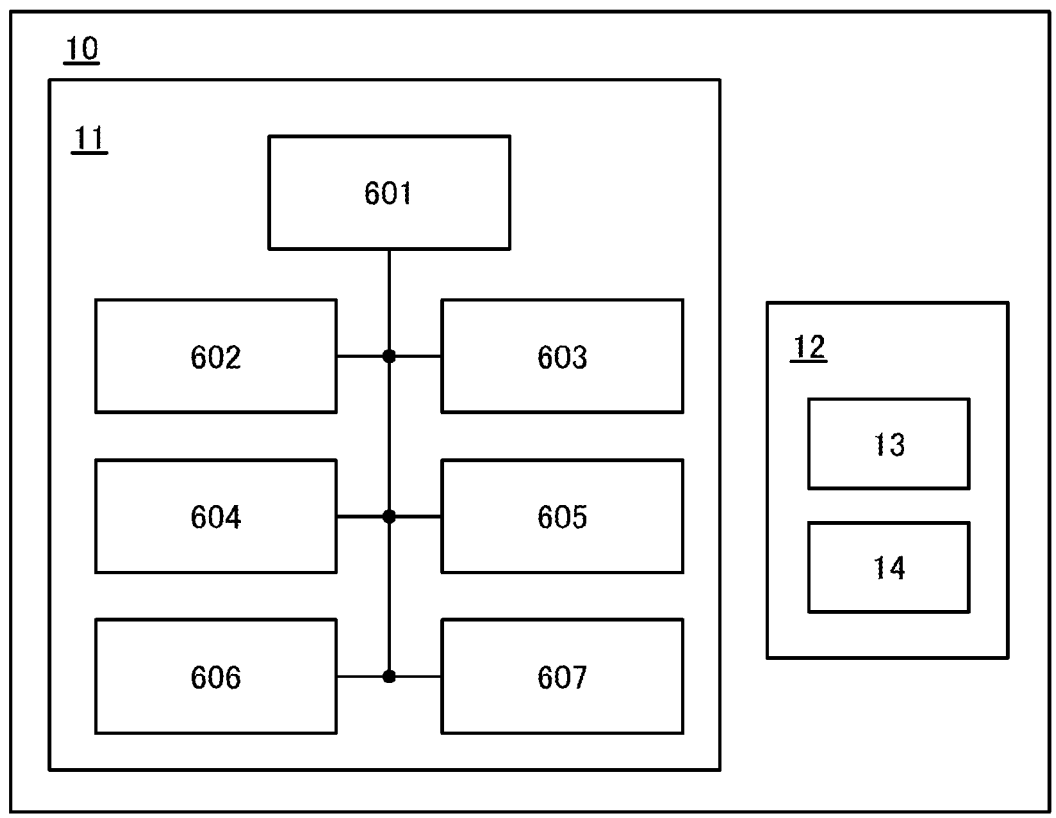
FIG. 14 illustrates a device structure.

A specific configuration example of the device 10 of one embodiment of the present invention will be described. FIG. 14 is a block diagram illustrating an example of the configuration of the device 10.

The device 10 illustrated in FIG. 14 includes the circuit 11 and the circuit 12. The circuit 11 includes a control unit 601, an arithmetic unit 602, a main memory 603, an input device 604, an output device 605, an interface (IF) 606, and a buffer memory device 607. The circuit 12 includes the circuit 13 and the circuit 14.

The control unit 601 has a function of collectively controlling operations of the arithmetic unit 602, the main memory 603, the input device 604, the output device 605, the IF 606, and the buffer memory device 607 included in the device 10 to decode and execute an input instruction included in a program such as an application. The arithmetic unit 602 has a function of performing a variety of arithmetic processing such as four arithmetic operations and logic operations.

Although FIG. 14 illustrates the control unit 601 and the arithmetic unit 602 as independent blocks, the device 10 may include a central processing unit having both the function of the control unit 601 and the function of the arithmetic unit 602, instead of the control unit 601 and the arithmetic unit 602.

The main memory 603 has a function of storing a program such as an application including a plurality of instructions, which is executed by the control unit 601, and data used for arithmetic processing performed by the arithmetic unit 602.

The buffer memory device 607 has a function of storing data obtained during or as a result of arithmetic processing in the arithmetic unit 602, and the like. The buffer memory device 607 may have a function of temporarily storing a program such as an application.

The input device 604 has a function of sending an externally input instruction to the device 10. As the input device 604, a keyboard, a mouse, or a touch panel can be used, for example.

The output device 605 has a function of outputting the operating state of the device 10, a result obtained by execution of a program such as an application, or the like as information. As the output device 605, a display, a projector, a printer, a plotter, or an audio output device can be used, for example.

The IF 606 is a data path between the circuit 11 and the circuit 12. Specifically, a test pattern generated in the circuit 13 is sent to the circuit 11 through the IF 606. Then, a signal obtained when the circuit 11 operates according to the test pattern is sent to the circuit 13 through the IF 606. When the circuit 14 functions as a set associative buffer memory device together with the buffer memory device 607, the circuit 14 and the buffer memory device 607 store data acquired during or as a result of arithmetic processing by the arithmetic unit 602, for example. The circuit 14 may have a function of temporarily storing a program such as an application.

Execution of an instruction is repeated in the control unit 601, whereby a program is executed.

Note that this embodiment can be implemented in combination with other embodiments as appropriate.

Embodiment 11

In the device of one embodiment of the present invention, the data retention time can be lengthened when the off-state current of the transistors 101 and 104 illustrated in FIG. 3, FIGS. 4A to 4D, and FIGS. 6, 7, and 9 is low. Thus, the transistors 101 and 104 preferably have a channel formation region in an oxide semiconductor film.

Figure 15A:
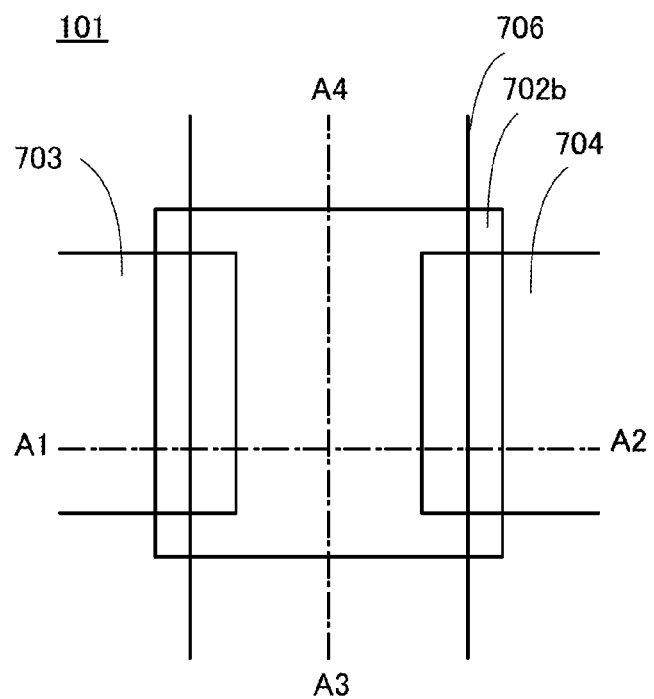
FIGS. 15A to 15C illustrate a transistor structure.
Figure 15C:
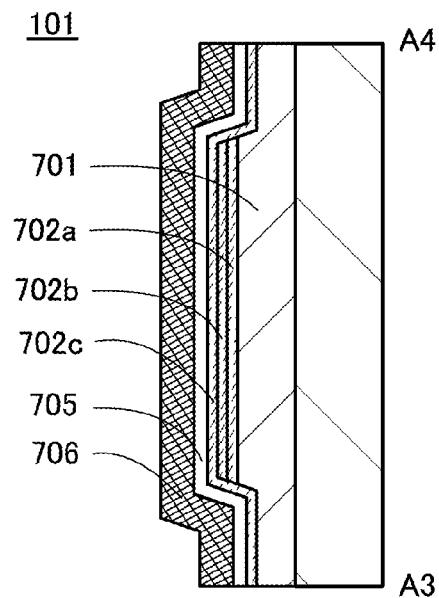
Figure 15B:
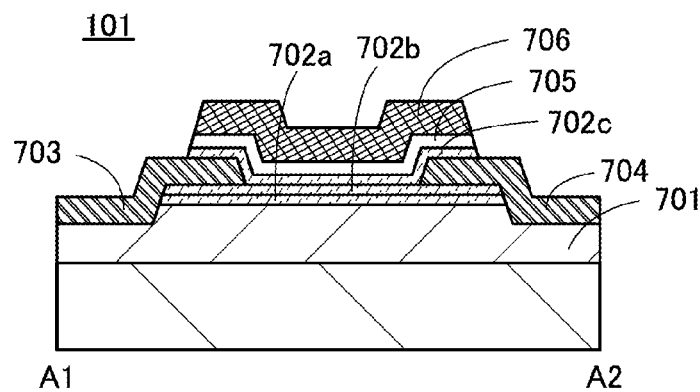

FIGS. 15A to 15C illustrate a structure example of the transistor 101 having a channel formation region in an oxide semiconductor film. FIG. 15A is a top view of the transistor 101. Note that insulating films are not illustrated in FIG. 15A in order to clarify the layout of the transistor 101. FIG. 15B is a cross-sectional view along the dashed line A1-A2 in the top view of FIG. 15A. FIG. 15C is a cross-sectional view along the dashed line A3-A4 in the top view of FIG. 15A. Although the structure of the transistor 101 is shown here, the transistor 104 can have a similar structure.

As illustrated in FIGS. 15A to 15C, the transistor 101 includes an oxide semiconductor film 702a and an oxide semiconductor film 702b that are stacked in this order over an insulating film 701; a conductive film 703 and a conductive film 704 that are electrically connected to the oxide semiconductor film 702b and function as a source electrode and a drain electrode; an oxide semiconductor film 702c over the oxide semiconductor film 702b, the conductive film 703, and the conductive film 704; an insulating film 705 that functions as a gate insulating film and is located over the oxide semiconductor film 702c; and a conductive film 706 that functions as a gate electrode and overlaps the oxide semiconductor films 702a to 702c with the insulating film 705 placed therebetween.

Figure 16A:
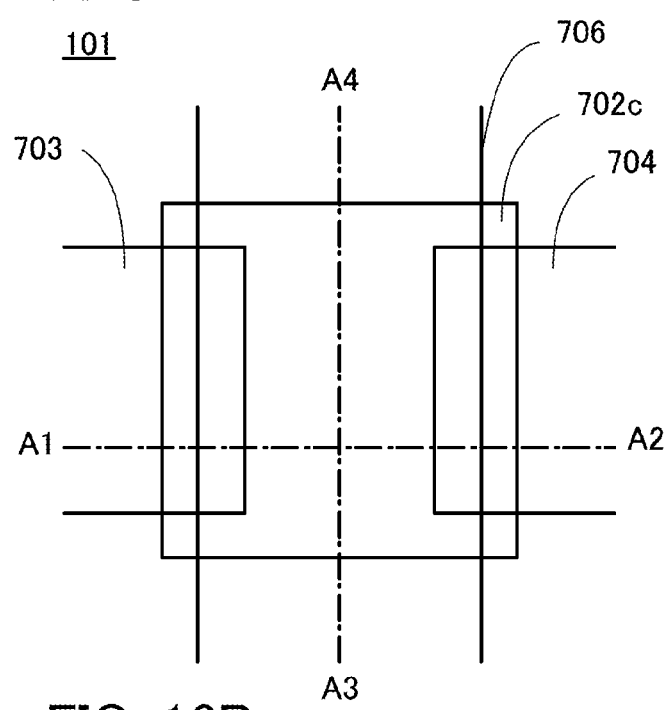
FIGS. 16A to 16C illustrate a transistor structure.
Figure 16C:
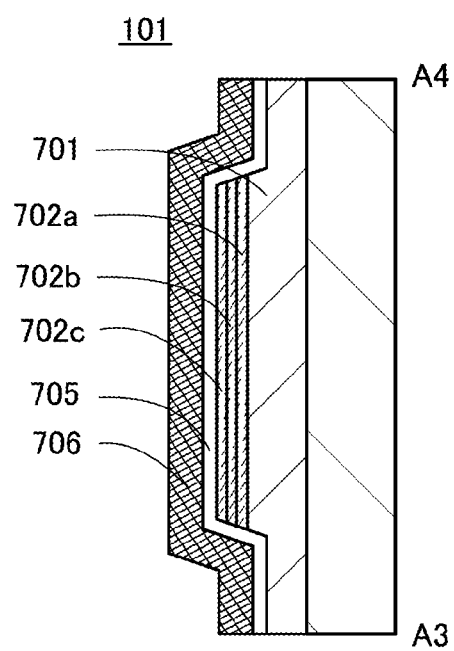
Figure 16B:
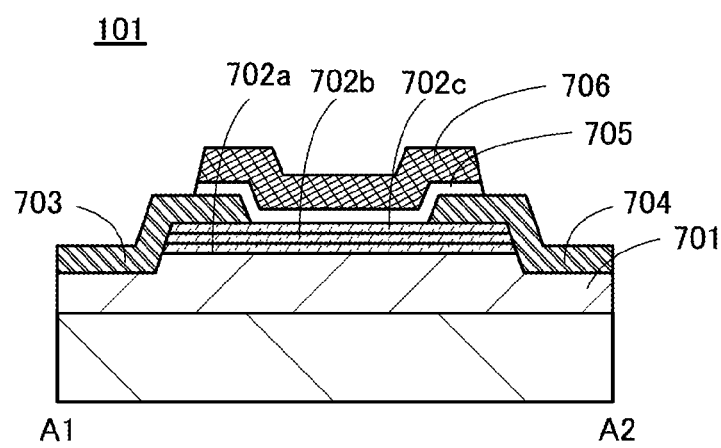

FIGS. 16A to 16C illustrates another specific example of the structure of the transistor 101. FIG. 16A is a top view of the transistor 101. Note that insulating films are not illustrated in FIG. 16A in order to clarify the layout of the transistor 101. FIG. 16B is a cross-sectional view along the dashed line A1-A2 in the top view of FIG. 16A. FIG. 16C is a cross-sectional view along the dashed line A3-A4 in the top view of FIG. 16A.

As illustrated in FIGS. 16A to 16C, the transistor 101 includes the oxide semiconductor films 702a to 702c that are stacked in this order over the insulating film 701; the conductive films 703 and 704 that are electrically connected to the oxide semiconductor film 702c and function as a source electrode and a drain electrode; the insulating film 705 that functions as a gate insulating film and is located over the oxide semiconductor film 702c, the conductive film 703, and the conductive film 704; and the conductive film 706 that functions as a gate electrode and overlaps the oxide semiconductor films 702a to 702c with the insulating film 705 placed therebetween.

FIGS. 15A to 15C and FIGS. 16A to 16C illustrate the structure examples of the transistor 101 in which the oxide semiconductor films 702a to 702c are stacked. The oxide semiconductor film of the transistor 101 is not limited to a stack including a plurality of oxide semiconductor films and may be a single oxide semiconductor film.

When the transistor 101 includes the semiconductor film including the oxide semiconductor films 702a to 702c stacked in this order, each of the oxide semiconductor films 702a and 702c is an oxide film that contains at least one of metal elements contained in the oxide semiconductor film 702b and in which the energy of the conduction band minimum is closer to the vacuum level than that of the oxide semiconductor film 702b by higher than or equal to 0.05 eV, 0.07 eV, 0.1 eV, or 0.15 eV and lower than or equal to 2 eV, 1 eV, 0.5 eV, or 0.4 eV. The oxide semiconductor film 702b preferably contains at least indium because carrier mobility is increased.

When the transistor 101 includes the semiconductor film with the above structure, when an electric field is applied to the semiconductor film by applying voltage to the gate electrode, a channel region is formed in the oxide semiconductor film 702b, which has the lowest conduction band minimum among the oxide semiconductor films. That is, the oxide semiconductor film 702c provided between the oxide semiconductor film 702b and the insulating film 705 makes it possible to form the channel region in the oxide semiconductor film 702b, which is separated from the insulating film 705.

Since the oxide semiconductor film 702c contains at least one of the metal elements contained in the oxide semiconductor film 702b, interface scattering is less likely to occur at the interface between the oxide semiconductor film 702b and the oxide semiconductor film 702c. Thus, carriers are not easily inhibited from moving at the interface, resulting in an increase in the field-effect mobility of the transistor 101.

If an interface level is formed at the interface between the oxide semiconductor film 702a and the oxide semiconductor film 702b, a channel region is formed also in the vicinity of the interface; thus, the threshold voltage of the transistor 101 varies. However, since the oxide semiconductor film 702a contains at least one of the metal elements contained in the oxide semiconductor film 702b, an interface level is less likely to be formed at the interface between the oxide semiconductor film 702a and the oxide semiconductor film 702b. Accordingly, the above structure can reduce variations in the electrical characteristics of the transistors 101, such as the threshold voltage.

A plurality of oxide semiconductor films are preferably stacked so that an interface level that inhibits carrier flow is not formed at the interface between the oxide semiconductor films due to an impurity existing between the oxide semiconductor films. This is because if an impurity exists between the stacked oxide semiconductor films, the continuity of the conduction band minimum between the oxide semiconductor films is lost, and carriers are trapped or disappear by recombination in the vicinity of the interface. By reducing an impurity existing between the films, a continuous junction (here, particularly a U-shape well structure with the conduction band minimum changed continuously between the films) is formed more easily than the case of merely stacking a plurality of oxide semiconductor films that contain at least one common metal as a main component.

In order to form such a continuous energy band, the films need to be stacked successively without being exposed to the air by using a multi-chamber deposition system (sputtering system) provided with a load lock chamber. Each chamber of the sputtering apparatus is preferably evacuated to a high vacuum (to about $5\times10^{-7}$ Pa to $1\times10^{-4}$ Pa) by an adsorption vacuum pump such as a cryopump so that water and the like acting as impurities for the oxide semiconductor are removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the sputtering gas is highly purified to have a dew point of −40° C. or lower, preferably −80° C. or lower, more preferably −100° C. or lower, moisture and the like can be prevented from entering the oxide semiconductor film as much as possible. Specifically, when the oxide semiconductor film 702b is an In-M-Zn oxide film (M is Ga, Y, Zr, La, Ce, or Nd) and a target having the atomic ratio of metal elements of In:M:Zn=$x_1$:$y_1$:$z_1$ is used to form the oxide semiconductor film 702b, $x_1/y_1$ ranges preferably from 1/3 to 6, more preferably from 1 to 6 and $z_1/y_1$ ranges preferably from 1/3 and to 6, more preferably from 1 to 6. Note that $z_1/y_1$ in the range of 1 to 6 facilitates formation of a c-axis aligned crystalline oxide semiconductor (CAAC-OS) film as the oxide semiconductor film 702b. Typical examples of the atomic ratio of the metal elements of the target are In:M:Zn=1:1:1 and In:M:Zn=3:1:2.

Specifically, when the oxide semiconductor films 702a and 702c are In-M-Zn oxide films (M is Ga, Y, Zr, La, Ce, or Nd) and the atomic ratio of metal elements of In to M and Zn in a target for forming the oxide semiconductor films 702a and 702c is $x_2$:$y_2$:z, it is preferable that $x_2/y_2$ be less than $x_1/y_1$ and that $z_2/y_2$ range from to 1/3 to 6, more preferably from 1 and to 6. Note that $z_2/y_2$ in the range of 1 to 6 facilitates formation of CAAC-OS films as the oxide semiconductor films 702a and 702c. Typical examples of the atomic ratio of the metal elements of the target are In:M:Zn=1:3:2, In:M:Zn=1:3:4, In:M:Zn=1:3:6, and In:M:Zn=1:3:8.

The oxide semiconductor films 702a and 702c each have a thickness of 3 nm to 100 nm, preferably 3 nm to 50 nm. The oxide semiconductor film 702b has a thickness of 3 nm to 200 nm, preferably 3 nm to 100 nm, more preferably 3 nm to 50 nm.

In the three-layer semiconductor film, each of the oxide semiconductor films 702a to 702c can be amorphous or crystalline. Note that the oxide semiconductor film 702b in which a channel region is formed is preferably crystalline, in which case the transistor 101 can have stable electrical characteristics.

Note that a channel formation region refers to a region of a semiconductor film of a transistor that overlaps with a gate electrode and is located between a source electrode and a drain electrode. A channel region refers to a region through which current mainly flows in the channel formation region.

For example, when an In—Ga—Zn oxide film formed by sputtering is used as each of the oxide semiconductor films 702a and 702c, the oxide semiconductor films 702a and 702c can be deposited with the use of an In—Ga—Zn oxide target containing In, Ga, and Zn at an atomic ratio of 1:3:2. The deposition conditions can be as follows, for example: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

When the oxide semiconductor film 702b is a CAAC-OS film, the oxide semiconductor film 702b is preferably deposited with the use of a polycrystalline target containing In—Ga—Zn oxide (In:Ga:Zn=1:1:1 [atomic ratio]). The deposition conditions can be as follows, for example: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

Although the oxide semiconductor films 702a to 702c can be formed by sputtering, they may be formed by another method, e.g., thermal CVD. Examples of thermal CVD include metal organic chemical vapor deposition (MOCVD) and atomic layer deposition (ALD).

A highly purified oxide semiconductor (purified oxide semiconductor) obtained by reduction of impurities such as moisture or hydrogen serving as electron donors (donors) and reduction of oxygen vacancies has few carrier sources and thus can be an i-type (intrinsic) semiconductor or a substantially i-type semiconductor. For this reason, a transistor having a channel formation region in a highly purified oxide semiconductor film exhibits extremely low off-state current and has high reliability. A transistor including a channel formation region in the oxide semiconductor film is likely to have positive threshold voltage (i.e., have normally-off characteristics).

A highly purified oxide semiconductor film has a low carrier density because of the reduction of impurity elements. The carrier density of the film is lower than $8 \times 10^{11}/\text{cm}^3$, preferably lower than $1 \times 10^{11}/\text{cm}^3$, further preferably lower than $1 \times 10^{10}/\text{cm}^3$ and can be $1 \times 10^{-9}/\text{cm}^3$ or higher.

Specifically, various experiments can prove a low off-state current of a transistor having a channel formation region in a highly purified oxide semiconductor film. For example, the off-state current of an element having a channel width of $1 \times 10^6$ μm and a channel length of 10 μm can be less than or equal to the measurement limit of a semiconductor parameter analyzer, that is, less than or equal to $1 \times 10^{-13}$ A at a voltage between source and drain electrodes (drain voltage) of 1 V to 10 V. In this case, the off-state current standardized on the channel width of the transistor is lower than or equal to 100 zA/μm. In addition, the off-state current is measured using a circuit in which a capacitor and a transistor are connected to each other and electric charge flowing into or from the capacitor is controlled by the transistor. In the measurement, a highly purified oxide semiconductor film is used for a channel formation region of the transistor, and the off-state current of the transistor is measured from a change in the amount of electric charge of the capacitor per unit time. As a result, it is found that when the voltage between the source and drain electrodes of the transistor is 3 V, a lower off-state current of several tens of yoctoamperes per micrometer (yA/μm) is obtained. Consequently, the transistor in which a highly purified oxide semiconductor film is used for a channel formation region has much lower off-state current than a transistor containing crystalline silicon.

When an oxide semiconductor film is used as the semiconductor film, the oxide semiconductor preferably contains at least indium (In) or zinc (Zn). Furthermore, as a stabilizer for reducing variations in electric characteristics of transistors using the oxide semiconductor, the oxide semiconductor preferably contains gallium (Ga), tin (Sn), hafnium (Hf), aluminum (Al), and/or zirconium (Zr) in addition to indium (In) and/or zinc (Zn).

An In—Ga—Zn oxide and an In—Sn—Zn oxide among oxide semiconductors have the following advantages over silicon carbide, gallium nitride, and gallium oxide: transistors with excellent electrical characteristics can be formed by sputtering or a wet process and thus can be mass-produced easily. Moreover, unlike in the case of using silicon carbide, gallium nitride, or gallium oxide, the use of the In—Ga—Zn oxide enables formation of transistors with excellent electrical characteristics over a glass substrate and the use of a larger substrate.

As another stabilizer, the oxide semiconductor may contain one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor, any of the following oxides can be used, for example: indium oxide, gallium oxide, tin oxide, zinc oxide, In—Zn oxide, Sn—Zn oxide, Al—Zn oxide, Zn—Mg oxide, Sn—Mg oxide, In—Mg oxide, In—Ga oxide, In—Ga—Zn oxide (also referred to as IGZO), In—Al—Zn oxide, In—Sn—Zn oxide, Sn—Ga—Zn oxide, Al—Ga—Zn oxide, Sn—Al—Zn oxide, In—Hf—Zn oxide, In—La—Zn oxide, In—Pr—Zn oxide, In—Nd—Zn oxide, In—Ce—Zn oxide, In—Sm—Zn oxide, In—Eu—Zn oxide, In—Gd—Zn oxide, In—Tb—Zn oxide, In—Dy—Zn oxide, In—Ho—Zn oxide, In—Er—Zn oxide, In—Tm—Zn oxide, In—Yb—Zn oxide, In—Lu—Zn oxide, In—Sn—Ga—Zn oxide, In—Hf—Ga—Zn oxide, In—Al—Ga—Zn oxide, In—Sn—Al—Zn oxide, In—Sn—Hf—Zn oxide, and In—Hf—Al—Zn oxide.

For example, an In—Ga—Zn oxide refers to an oxide containing In, Ga, and Zn, and there is no limitation on the ratio of In, Ga, and Zn. Furthermore, the In—Ga—Zn oxide may contain a metal element other than In, Ga, and Zn. The In—Ga—Zn oxide has sufficiently high resistance when no electric field is applied thereto, so that off-state current can be sufficiently reduced. Moreover, the In—Ga—Zn oxide has high mobility.

For example, high mobility can be obtained relatively easily with an In—Sn—Zn oxide. Meanwhile, when an In—Ga—Zn oxide is used, the mobility can be increased by reduction in the defect density in a bulk.

In the transistor 101, a metal in the source and drain electrodes might extract oxygen from the oxide semiconductor film depending on a conductive material used for the source and drain electrodes. In such a case, a region of the oxide semiconductor film in contact with the source electrode or the drain electrode becomes an n-type region due to the formation of an oxygen vacancy. The n-type region serves as a source region or a drain region, resulting in a decrease in the contact resistance between the oxide semiconductor film and the source electrode or the drain electrode. Thus, the formation of the n-type regions increases the mobility and the on-state current of the transistor 101, leading to high-speed operation of a device using the transistor 101.

Note that the extraction of oxygen by a metal in the source and drain electrodes is probably caused when the source and drain electrodes are formed by sputtering or when heat treatment is performed after the formation of the source and drain electrodes. The n-type region is more likely to be formed by forming the source and drain electrodes with the use of a conductive material that is easily bonded to oxygen. Examples of such a conductive material include Al, Cr, Cu, Ta, Ti, Mo, and W.

In the case where the semiconductor film including the stacked oxide semiconductor films is used in the transistor 101, the n-type region preferably extends to the oxide semiconductor film 702b serving as a channel region in order that the mobility and on-state current of the transistor 101 can be increased and the device can operate at higher speed.

The insulating film 701 preferably has a function of supplying part of oxygen to the oxide semiconductor films 702a to 702c by heating. It is preferable that the number of defects in the insulating film 701 be small, and that typically the spin density of g=2.001 due to a dangling bond of silicon be lower than or equal to $1\times10^{18}$ spins/cm$^3$. The spin density is measured by ESR spectroscopy.

The insulating film 701 is preferably formed using an oxide to have a function of supplying part of oxygen to the oxide semiconductor films 702a to 702c by heating. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 701 can be formed by plasma-enhanced CVD, sputtering, or the like.

Note that in this specification, oxynitride contains more oxygen than nitrogen, and nitride oxide contains more nitrogen than oxygen.

Note that in the transistor 101 illustrated in FIGS. 15A to 15C and FIGS. 16A to 16C, the conductive film 706 overlaps with end portions of the oxide semiconductor film 702b including a channel region that do not overlap with the conductive films 703 and 704, that is, end portions of the oxide semiconductor film 702b that are in a region different from regions where the conductive films 703 and 704 are located. If the end portions of the oxide semiconductor film 702b are exposed to plasma by etching for forming the end portions, chlorine radical, fluorine radical, or the like generated from an etching gas is easily bonded to a metal element contained in the oxide semiconductor. For this reason, in the end portions of the oxide semiconductor film, oxygen bonded to the metal element is easily released, so that an oxygen vacancy is easily formed and the oxide semiconductor film easily has n-type conductivity. However, in the transistor 101 in FIGS. 15A to 15C and FIGS. 16A to 16C, since the end portions of the oxide semiconductor film 702b that do not overlap with the conductive films 703 and 704 overlap with the conductive film 706, an electric field applied to the end portions can be adjusted by controlling the potential of the conductive film 706. Consequently, the flow of current between the conductive films 703 and 704 through the end portions of the oxide semiconductor film 702b can be controlled by the potential supplied to the conductive film 706. This structure of the transistor 101 is referred to as a surrounded channel (s-channel) structure.

Specifically, in the s-channel structure, when a potential at which the transistor 101 is turned off is supplied to the conductive film 706, the amount of off-state current that flows between the conductive films 703 and 704 through the end portions of the oxide semiconductor film 702b can be small. For this reason, even when the distance between the conductive films 703 and 704 at the end portions of the oxide semiconductor film 702b is reduced in the transistor 101 as a result of reducing the channel length to obtain high on-state current, the transistor 101 can exhibit low off-state current. Thus, the transistor 101 with a short channel length can exhibit high on-state current and low off-state current.

Specifically, in the s-channel structure, when a potential at which the transistor 101 is turned on is supplied to the conductive film 706, the amount of current that flows between the conductive films 703 and 704 through the end portions of the oxide semiconductor film 702b can be large. The current contributes to an increase in the field-effect mobility and on-state current of the transistor 101. With the overlap of the end portions of the oxide semiconductor film 702b and the conductive film 706, carriers flow in a wide region of the oxide semiconductor film 702b without being limited to a region in the vicinity of the interface of the oxide semiconductor film 702b near the insulating film 705, leading to an increase in the amount of carriers that move in the transistor 101. As a result, the on-state current of the transistor 101 is increased, and the field-effect mobility is increased to 10 cm$^2$/V·s or higher or to 20 cm$^2$/V·s or higher, for example. Note that here, field-effect mobility is not an approximate value of the mobility as the physical property of the oxide semiconductor film, but is an index of current drive capability in a saturation region of the transistor and apparent field-effect mobility.

A structure of the oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a CAAC-OS film, and the like.

The amorphous oxide semiconductor film has disordered atomic arrangement and no crystalline component. A typical example of the amorphous oxide semiconductor film is an oxide semiconductor film in which no crystal part exists even in a microscopic region and which is entirely amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is an oxide semiconductor film including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer reflects unevenness of a surface over which the CAAC-OS film is formed (hereinafter a surface over which the CAAC-OS film is formed is referred to as a formation surface) or a top surface of the CAAC-OS film, and is arranged parallel to the formation surface or the top surface of the CAAC-OS film.

In this specification, the term "substantially parallel" indicates that the angle formed between two straight lines ranges from −10° to 10°, and accordingly also includes the case where the angle ranges from −5° to 5°. The term "substantially perpendicular" indicates that the angle formed between two straight lines ranges from 80° to 100°, and accordingly also includes the case where the angle ranges from 85° to 95°.

On the other hand, according to the TEM image of the CAAC-OS film observed in a direction substantially perpendicular to the sample surface (plan-view TEM image), metal atoms are arranged in a triangular or hexagonal configuration in the crystal parts. However, there is no regularity of arrangement of metal atoms between different crystal parts.

From the results of the cross-sectional TEM image and the plan-view TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently at a diffraction angle (2θ) of around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently at 2θ of around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed when φ scan is performed with 2θ fixed at around 56°.

According to the above results, in the CAAC-OS film, while the directions of a-axes and b-axes are irregularly oriented between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

Furthermore, the crystallinity in the CAAC-OS film is not necessarily uniform. For example, in the case where crystal growth leading to the CAAC-OS film occurs from the vicinity of the top surface of the film, the crystallinity in the vicinity of the top surface is higher than that in the vicinity of the formation surface in some cases. Moreover, when an impurity is added to the CAAC-OS film, the crystallinity in a region to which the impurity is added is changed, and the crystallinity in the CAAC-OS film may vary depending on regions.

When the CAAC-OS film with an InGaZnO$_4$ crystal is analyzed by an out-of-plane method, a peak may also be observed at 2θ of around 36° as well as at 2θ of around 31°. The peak at 2θ of around 36° indicates that a crystal having no c-axis alignment is included in part of the CAAC-OS film. It is preferable that in the CAAC-OS film, a peak appear at 2θ of around 31° and a peak not appear at 2θ of around 36°.

With the use of the CAAC-OS film in a transistor, variation in the electrical characteristics of the transistor due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

For the deposition of the CAAC-OS film, the following conditions are preferably used.

Decay of the crystal state due to impurities can be prevented by reducing the amount of impurities entering the CAAC-OS film during the deposition, for example, by reducing the concentration of impurities (e.g., hydrogen, water, carbon dioxide, and nitrogen) that exist in a treatment chamber or by reducing the concentration of impurities in a deposition gas. Specifically, a deposition gas with a dew point of −80° C. or lower, preferably −100° C. or lower is used.

By increasing the substrate heating temperature during the deposition, migration of a sputtered particle occurs after the sputtered particle reaches a substrate. Specifically, the substrate heating temperature during the deposition ranges from 100° C. to 740° C., preferably from 200° C. to 500° C. When the substrate heating temperature during the deposition is increased and flat-plate-like or pellet-like sputtered particles reach the substrate, migration occurs on the substrate, and a flat plane of each sputtered particle is attached to the substrate.

It is preferable that the proportion of oxygen in the deposition gas be increased and the power be optimized in order to reduce plasma damage in the deposition. The proportion of oxygen in the deposition gas is 30 vol % or higher, preferably 100 vol %.

As an example of the target, an In—Ga—Zn oxide target is described below.

A polycrystalline In—Ga—Zn oxide target is made by mixing InO$_X$ powder, GaO$_Y$ powder, and ZnO$_Z$ powder in a predetermined molar ratio, applying pressure, and performing heat treatment at a temperature of 1000° C. to 1500° C. Note that X, Y, and Z are each a given positive number. Here, the predetermined molar ratio of InO$_X$ powder to GaO$_Y$ powder and ZnO$_Z$ powder is, for example, 2:2:1, 8:4:3, 3:1:1, 1:1:1, 4:2:3, or 3:1:2. The kinds of powder and the molar ratio for mixing powder can be determined as appropriate depending on the desired target.

Alkali metal is not a constituent element of an oxide semiconductor and thus is an impurity. Likewise, alkaline earth metal is an impurity when it is not a constituent element of the oxide semiconductor. When an insulating film in contact with an oxide semiconductor film is an oxide, Na, among the alkali metals, diffuses into the insulating film and becomes Na$^+$. Furthermore, in the oxide semiconductor film, Na cuts or enters a bond between metal and oxygen that are constituent elements of the oxide semiconductor. As a result, the electrical characteristics of the transistor deteriorate, for example, the transistor is placed in a normally-on state because of a negative shift of the threshold voltage or the mobility is decreased. In addition, the characteristics of transistors vary. Specifically, the Na concentration measured by secondary ion mass spectrometry is preferably 5×10$^{16}$/cm$^3$ or lower, more preferably 1×10$^{16}$/cm$^3$ or lower, still more preferably 1×10$^{15}$/cm$^3$ or lower. Similarly, the measured Li concentration is preferably 5×10$^{15}$/cm$^3$ or lower, more preferably 1×10$^{15}$/cm$^3$ or lower. Similarly, the measured K concentration is preferably 5×10$^{15}$/cm$^3$ or lower, more preferably 1×10$^{15}$/cm$^3$ or lower.

In the case where metal oxide containing indium is used, silicon or carbon having higher bond energy with oxygen than indium might cut the bond between indium and oxygen, and an oxygen vacancy may be formed. Accordingly, like alkali metal or alkaline earth metal, silicon or carbon contained in the oxide semiconductor film is likely to cause deterioration of the electric characteristics of the transistor. Thus, the concentrations of silicon and carbon in the oxide semiconductor film are preferably low. Specifically, the C concentration or the Si concentration measured by secondary ion mass spectrometry is preferably $1 \times 10^{18}/cm^3$ or lower. In this case, the deterioration of the electric characteristics of the transistor can be prevented, so that the reliability of a device can be improved.

Figure 17A:
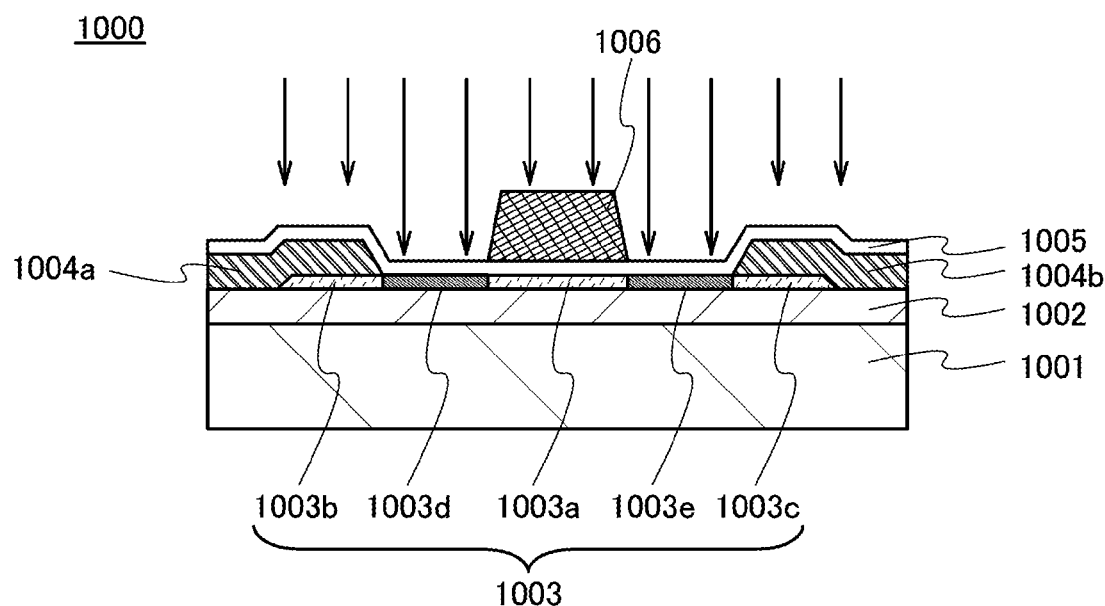
FIGS. 17A and 17B illustrate transistor structures.
Figure 17B:
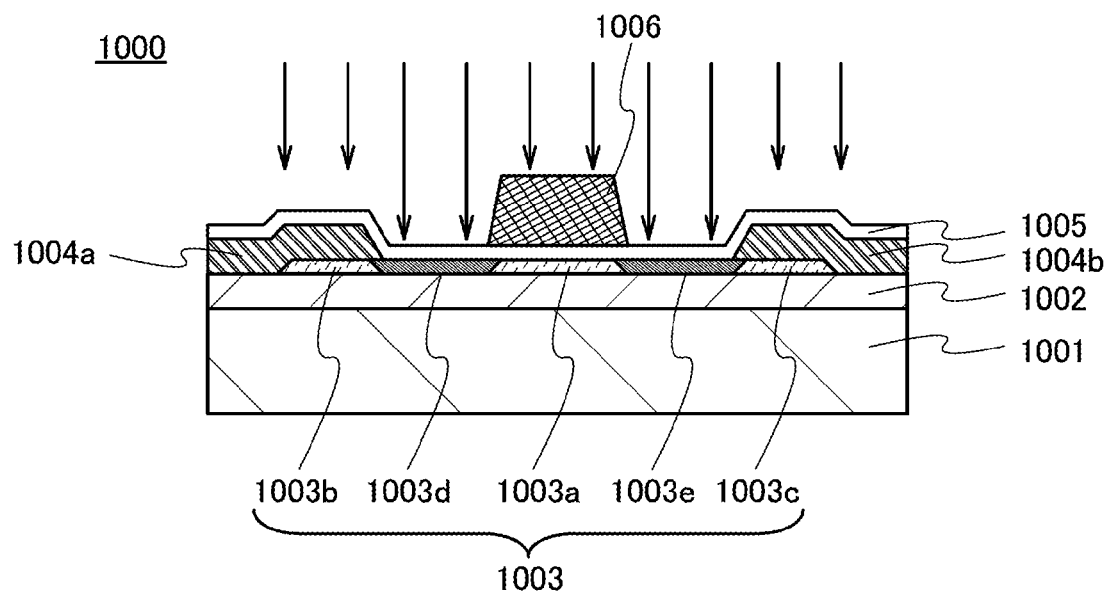

The transistors 101 and 104 can have a structure illustrated in FIG. 17A or FIG. 17B. A transistor 1000 illustrated in FIG. 17A includes an insulating film 1002 over a substrate 1001, an oxide semiconductor film 1003 over the insulating film 1002, conductive films 1004a and 1004b that are electrically connected to the oxide semiconductor film 1003 and function as a source electrode and a drain electrode, an insulating film 1005 that is provided over the oxide semiconductor film 1003 and the conductive films 1004a and 1004b and functions as a gate insulating layer, and a conductive film 1006 that is provided over the insulating film 1005 to overlap with the oxide semiconductor film 1003 and functions as a gate electrode. The oxide semiconductor film 1003 includes a first region 1003a overlapping with the conductive film 1006, a second region 1003b overlapping with the conductive film 1004a, a third region 1003c overlapping with the conductive film 1004b, a fourth region 1003d between the first region 1003a and the second region 1003b, and a fifth region 1003e between the first region 1003a and the third region 1003c.

In the oxide semiconductor film 1003, the fourth and fifth regions 1003d and 1003e have a higher impurity element concentration than the first to third regions 1003a to 1003c. As a result, the fourth and fifth regions 1003d and 1003e have lower resistance than the first to third regions 1003a to 1003c. That is, the fourth and fifth regions 1003d and 1003e function as low-resistance regions.

The fourth and fifth regions 1003d and 1003e can be formed in a self-aligned manner by adding an impurity element with the use of the conductive films 1004a, 1004b, and 1006 as masks as illustrated in FIG. 17A. That is, the low-resistance regions can be formed without an increase in the number of steps. Examples of the impurity element are rare gas elements such as Ar.

For the insulating film 1002, the oxide semiconductor film 1003, the conductive films 1004a and 1004b, the insulating film 1005, and the conductive film 1006, materials used in the transistors illustrated in FIGS. 15A to 15C and FIGS. 16A to 16C can be used as appropriate.

Alternatively, in the transistor 1000, at least part of the fourth and fifth regions 1003d and 1003e serving as low-resistance regions may overlap with the conductive film 1006 as illustrated in FIG. 17B.

Note that this embodiment can be implemented in combination with other embodiments as appropriate.

Embodiment 12

The device of one embodiment of the present invention can be used for display devices, personal computers, and image reproducing devices provided with recording media (typically, devices that reproduce the content of recording media such as digital versatile discs (DVD) and have displays for displaying the reproduced images). Other examples of electronic devices that can be equipped with the device of one embodiment of the present invention are mobile phones, game machines including portable game consoles, portable information appliances, e-book devices, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 18A to 18F illustrate specific examples of such electronic devices.

Figure 18A:
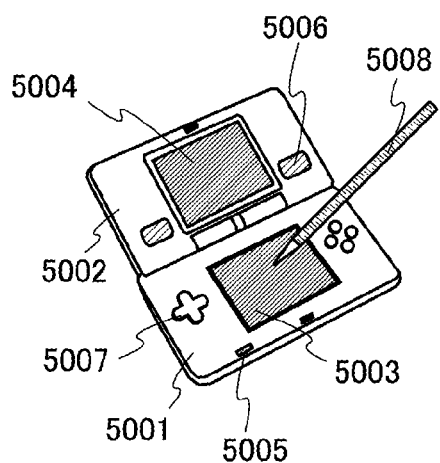
FIGS. 18A to 18F each illustrate an electronic device.

FIG. 18A illustrates a portable game console including a housing 5001, a housing 5002, a display portion 5003, a display portion 5004, a microphone 5005, speakers 5006, an operation key 5007, a stylus 5008, and the like. The device of one embodiment of the present invention can be used for a variety of integrated circuits included in the portable game console. Although the portable game console illustrated in FIG. 18A has the two display portions 5003 and 5004, the number of display portions included in a portable game console is not limited to two.

Figure 18B:
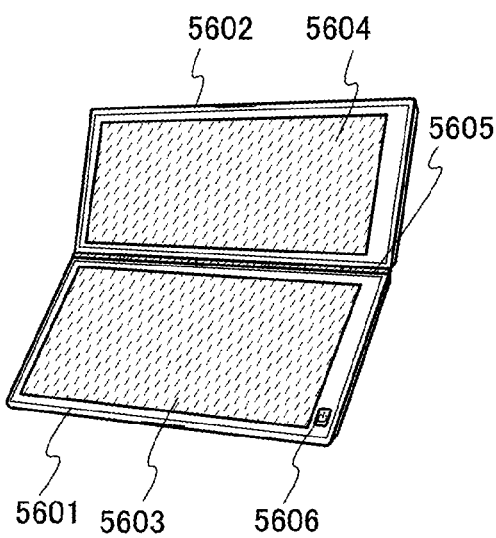

FIG. 18B illustrates a portable information appliance including a first housing 5601, a second housing 5602, a first display portion 5603, a second display portion 5604, a joint 5605, an operation key 5606, and the like. The device of one embodiment of the present invention can be used for a variety of integrated circuits included in the portable information appliance. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. A display device with a position input function may be used as at least one of the first display portion 5603 and the second display portion 5604. Note that the position input function can be added by providing a touch panel in a display device or by providing a photoelectric conversion element called a photosensor in a pixel area of a display device.

Figure 18C:
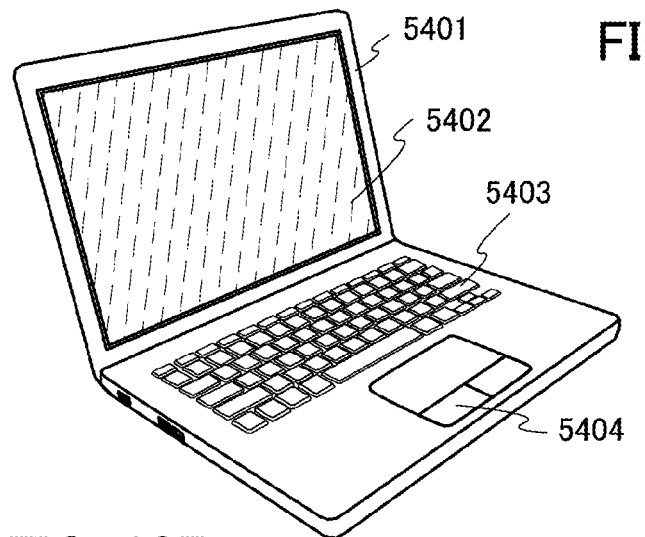

FIG. 18C illustrates a laptop including a housing 5401, a display portion 5402, a keyboard 5403, a pointing device 5404, and the like. The device of one embodiment of the present invention can be used for a variety of integrated circuits included in a laptop.

Figure 18D:
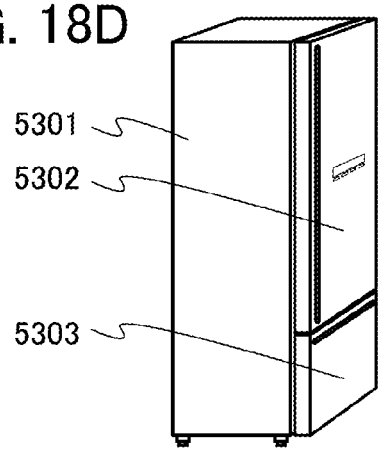

FIG. 18D illustrates an electric refrigerator-freezer including a housing 5301, a refrigerator door 5302, a freezer door 5303, and the like. The device of one embodiment of the present invention can be used for a variety of integrated circuits included in the electric refrigerator-freezer.

Figure 18E:
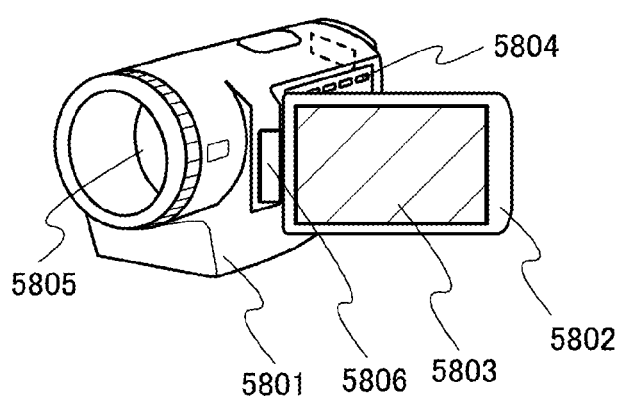

FIG. 18E illustrates a video camera including a first housing 5801, a second housing 5802, a display portion 5803, an operation key 5804, a lens 5805, a joint 5806, and the like. The device of one embodiment of the present invention can be used for a variety of integrated circuits included in the video camera. The operation key 5804 and the lens 5805 are provided in the first housing 5801. The display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 18F:
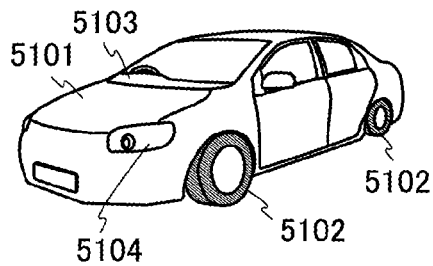

FIG. 18F illustrates a passenger car including a car body 5101, wheels 5102, a dashboard 5103, lights 5104, and the like. The device of one embodiment of the present invention can be used for a variety of integrated circuits included in the passenger car.

EXPLANATION OF REFERENCE

10: device, 11: circuit, 12: circuit, 13: circuit, 14: circuit, 15: circuit, 16: memory circuit, 17: circuit, 18: comparator circuit, 19: memory region, 20: tag field, 21: data field, 22: processor, 23: signal, 30: circuit, 40: cell, 50: cell, 60: latch circuit, 70: latch circuit, 101: transistor, 102: transistor, 103: capacitor, 104: transistor, 105: transistor, 106: capacitor, 107: transistor, 108: transistor, 109: transistor, 110: inverter, 111: transistor, 112: inverter, 113: inverter, 120: transistor, 121: transistor, 130: inverter, 131: inverter, 142: wiring, 143: wiring, 144: wiring, 145: wiring, 146: wiring, 147: wiring, 148: wiring, 201: wiring, 202: wiring, 203: wiring, 204: wiring, 205: wiring, 206: wiring, 207: wiring, 210: wiring, 300: cell array, 310: driver circuit, 311: circuit, 312: circuit, 320: driver circuit, 321: circuit, 322: circuit, 323: switch, 330: driver circuit, 331: circuit, 410: circuit, 560: LUT, 561: flip-flop, 562: memory device, 562a: memory device, 562b: memory device, 563: input terminal, 564: output terminal, 565: output terminal, 566: AND circuit, 568: multiplexer, 601: control unit, 602: arithmetic unit, 603: main memory, 604: input device, 605: output device, 606: IF, 607: buffer memory device, 701: insulating film, 702a: oxide semiconductor film, 702b: oxide semiconductor film, 702c: oxide semiconductor film, 703: conductive film, 704: conductive film, 705: insulating film, 706: conductive film, 1000: transistor, 1001: substrate, 1002: insulating film, 1003: oxide semiconductor film, 1004a: conductive film, 1004b: conductive film, 1005: insulating film, 1006: conductive film, 5001: housing, 5002: housing, 5003: display portion, 5004: display portion, 5005: microphone, 5006: speaker, 5007: operation key, 5008: stylus, 5101: car body, 5102: wheel, 5103: dashboard, 5104: light, 5301: housing, 5302: refrigerator door, 5303: freezer door, 5401: housing, 5402: display portion, 5403: keyboard, 5404: pointing device, 5601: housing, 5602: housing, 5603: display portion, 5604: display portion, 5605: joint, 5606: operation key, 5801: housing, 5802: housing, 5803: display portion, 5804: operation key, 5805: lens, 5806: joint This application is based on Japanese Patent Application serial no. 2014-002134 filed with Japan Patent Office on Jan. 9, 2014, the entire contents of which are hereby incorporated by reference.

The invention claimed is:

1. A device comprising:
a first circuit; and
a second circuit,
wherein the first circuit comprises a first memory,
wherein the first memory is configured to store first data corresponding to a first address of a first instruction of the first circuit,
wherein the second circuit comprises a second memory, a third memory, a fourth memory, and a fifth memory,
wherein the second memory is configured to store second data to generate a signal for an operation test of the first circuit, and configured to store third data corresponding to a second address of a second instruction of the first circuit after the operation test,
wherein the third memory is configured to store fifth data to generate the signal for the operation test of the first circuit, and configured to store inverted data of the third data after the operation test,
wherein the fourth memory is configured to store sixth data to generate the signal for the operation test of the first circuit, and configured to store seventh data corresponding to a third address of a third instruction of the first circuit after the operation test,
wherein the fifth memory is configured to store eighth data to generate the signal for the operation test of the first circuit, and configured to store inverted data of the seventh data after the operation test,
wherein the second circuit is configured to compare the third data and fourth data corresponding to a fourth address of a fourth instruction of the first circuit after the operation test, and
wherein the second circuit is configured to compare the seventh data and the fourth data corresponding to the fourth address of the fourth instruction of the first circuit after the operation test.

2. The device according to claim 1,
wherein the second circuit is configured to serve as a memory region in a cache memory of the first circuit, and configured to determine whether the third data and the fourth data input from the first circuit match or not.

3. The device according to claim 1,
wherein the second memory comprises a first transistor and a second transistor, and
wherein a first terminal of the first transistor is electrically connected to a gate of the second transistor.

4. The device according to claim 1,
wherein the second memory comprises a first transistor and a second transistor,
wherein a first terminal of the first transistor is electrically connected to a gate of the second transistor, and
wherein the first transistor comprises a channel formation region comprising an oxide semiconductor.

5. The device according to claim 1,
wherein the second memory comprises a first transistor and a second transistor,
wherein a first terminal of the first transistor is electrically connected to a gate of the second transistor,
wherein the first transistor comprises a channel formation region comprising an oxide semiconductor, and
wherein the oxide semiconductor comprises In, Ga, and Zn.

6. The device according to claim 1,
wherein the second circuit is configured to serve as a memory region in a cache memory of the first circuit, and configured to determine whether the third data and the fourth data input from the first circuit match or not,
wherein the second memory comprises a first transistor and a second transistor,
wherein a first terminal of the first transistor is electrically connected to a gate of the second transistor, and
wherein the first transistor comprises a channel formation region comprising an oxide semiconductor.

7. A device comprising:
a first circuit; and
a second circuit,
wherein the first circuit comprises a first memory,
wherein the first memory is configured to store first data corresponding to a first address of a first instruction of the first circuit,
wherein the second circuit comprises a second memory and a third memory,
wherein the second memory is configured to store second data to generate a signal for an operation test of the first circuit, and configured to store third data corresponding to a second address of a second instruction of the first circuit after the operation test, wherein the third memory is configured to store fourth data to generate the signal for the operation test of the first circuit, and configured to store inverted data of the third data after the operation test, and wherein the second circuit is configured to compare the third data and fifth data corresponding to a third address of a third instruction of the first circuit after the operation test.

8. The device according to claim 7, wherein the second circuit comprises a fourth memory, and wherein the fourth memory is configured to store sixth data to generate the signal for the operation test of the first circuit, and configured to store seventh data corresponding to the second instruction of the first circuit after the operation test.

9. The device according to claim 7, wherein the second circuit is configured to serve as a memory region in a cache memory of the first circuit, and configured to determine whether the third data and the fourth data input from the first circuit match or not.

10. The device according to claim 7, wherein the second memory comprises a first transistor and a second transistor, and wherein a first terminal of the first transistor is electrically connected to a gate of the second transistor.

11. The device according to claim 7, wherein the second memory comprises a first transistor and a second transistor, wherein a first terminal of the first transistor is electrically connected to a gate of the second transistor, and wherein the first transistor comprises a channel formation region comprising an oxide semiconductor.

12. The device according to claim 7, wherein the second memory comprises a first transistor and a second transistor, wherein a first terminal of the first transistor is electrically connected to a gate of the second transistor, wherein the first transistor comprises a channel formation region comprising an oxide semiconductor, and wherein the oxide semiconductor comprises In, Ga, and Zn.

13. The device according to claim 7, wherein the second circuit is configured to serve as a memory region in a cache memory of the first circuit, and configured to determine whether the third data and the fourth data input from the first circuit match or not, wherein the second memory comprises a first transistor and a second transistor, wherein a first terminal of the first transistor is electrically connected to a gate of the second transistor, and wherein the first transistor comprises a channel formation region comprising an oxide semiconductor.

14. A device comprising:

a processor; and a programmable device, wherein the processor comprises a cache memory, wherein the cache memory is configured to store data corresponding to an address of a first instruction of the processor, wherein the programmable device comprises a first configuration memory and a second configuration memory, wherein the first configuration memory is configured to store first configuration data to generate a signal for an operation test of the processor, and configured to store data corresponding to an address of a second instruction of the processor, wherein the second configuration memory is configured to store second configuration data to generate the signal for the operation test of the processor, and configured to store inverted data of the data corresponding to the address of the second instruction of the processor after the operation test, and wherein the programmable device is configured to compare the address of the second instruction of the processor and an address of a third instruction of the processor after the operation test.

15. The device according to claim 14, wherein the programmable device comprises a third configuration memory, and wherein the third configuration memory is configured to store third configuration data to generate the signal for the operation test of the processor, and configured to store data corresponding to the second instruction of the processor after the operation test.

16. The device according to claim 15, wherein at least one of the first configuration memory, the second configuration memory, and the third configuration memory comprises a first transistor and a second transistor, and wherein a first terminal of the first transistor is electrically connected to a gate of the second transistor.

17. The device according to claim 15, wherein at least one of the first configuration memory, the second configuration memory, and the third configuration memory comprises a first transistor and a second transistor, wherein a first terminal of the first transistor is electrically connected to a gate of the second transistor, and wherein the first transistor comprises a channel formation region comprising an oxide semiconductor.

18. The device according to claim 15, wherein at least one of the first configuration memory, the second configuration memory, and the third configuration memory comprises a first transistor and a second transistor, wherein a first terminal of the first transistor is electrically connected to a gate of the second transistor, wherein the first transistor comprises a channel formation region comprising an oxide semiconductor, and wherein the oxide semiconductor comprises In, Ga, and Zn.

19. The device according to claim 15, wherein the programmable device is configured to determine whether the address of the second instruction of the processor and the address of the third instruction of the processor match or not after the operation test.

* * * * *